(12) United States Patent
Koike et al.

(10) Patent No.: US 9,947,900 B2
(45) Date of Patent: Apr. 17, 2018

(54) ORGANIC ELECTROLUMINESCENCE DEVICE AND METHOD FOR MANUFACTURING ORGANIC ELECTROLUMINESCENCE DEVICE

(71) Applicant: Sharp Kabushiki Kaisha, Sakai, Osaka (JP)

(72) Inventors: Eiji Koike, Sakai (JP); Hideki Uchida, Sakai (JP); Katsuhiro Kikuchi, Sakai (JP); Yoshiyuki Isomura, Sakai (JP); Satoshi Inoue, Sakai (JP); Yuto Tsukamoto, Sakai (JP); Masanori Ohara, Sakai (JP); Kazuki Matsunaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/511,042

(22) PCT Filed: Sep. 10, 2015

(86) PCT No.: PCT/JP2015/075699
§ 371 (c)(1),
(2) Date: Mar. 14, 2017

(87) PCT Pub. No.: WO2016/043113
PCT Pub. Date: Mar. 24, 2016

(65) Prior Publication Data
US 2017/0256748 A1 Sep. 7, 2017

(30) Foreign Application Priority Data
Sep. 16, 2014 (JP) ................................. 2014-188144

(51) Int. Cl.
*H01L 29/08* (2006.01)
*H01L 27/15* (2006.01)
(Continued)

(52) U.S. Cl.
CPC ...... *H01L 51/5271* (2013.01); *H01L 51/5036* (2013.01); *H01L 51/5268* (2013.01);
(Continued)

(58) Field of Classification Search
CPC . H01L 51/50; H01L 51/5032; H01L 51/5068; H01L 51/5271; H01L 51/56;
(Continued)

(56) References Cited

U.S. PATENT DOCUMENTS 9,735,387 B2 * 8/2017 Kang .................. H01L 51/5218
2004/0211971 A1 10/2004 Takei et al.
(Continued)

FOREIGN PATENT DOCUMENTS

JP 2003-229283 A 8/2003
JP 2003-332067 A 11/2003
(Continued)

OTHER PUBLICATIONS

Official Communication issued in International Patent Application No. PCT/JP2015/075699, dated Nov. 24, 2015.

*Primary Examiner* — Hsien Ming Lee
(74) *Attorney, Agent, or Firm* — Keating & Bennett, LLP

(57) ABSTRACT

An organic EL device according to the present invention includes: a first structure section; and a second structure section. The first structure section includes: a recess; a reflection layer provided along an inner surface of the recess; a filling layer filled at an inner side of the recess via the reflection layer; a first electrode; an organic layer including a light-emitting layer; and a second electrode. The second structure section includes: a reflection layer provided on a flat surface of the base material; a first electrode; an organic layer including a light-emitting layer; and a second electrode.

20 Claims, 13 Drawing Sheets

(51) Int. Cl.
*H01L 21/00* (2006.01)
*H01L 51/40* (2006.01)
*H01L 51/52* (2006.01)
*H01L 51/50* (2006.01)
*H01L 51/56* (2006.01)

(52) U.S. Cl.
CPC .......... *H01L 51/56* (2013.01); *H01L 51/5056* (2013.01); *H01L 51/5072* (2013.01); *H01L 51/5088* (2013.01); *H01L 51/5092* (2013.01)

(58) Field of Classification Search
CPC ............... H01L 51/504; H01L 51/5218; H01L 2924/12044; H01L 27/32; G02B 6/007
USPC ........ 438/82, 99; 257/40, E33.001, E25.008, 257/E51.018; 313/499–509; 428/690, 428/917
See application file for complete search history.

(56) References Cited

U.S. PATENT DOCUMENTS

| | | |
|---|---|---|
| 2010/0164842 A1 | 7/2010 | Ishihara et al. |
| 2014/0264291 A1 | 9/2014 | Zhang et al. |

FOREIGN PATENT DOCUMENTS

| | | |
|---|---|---|
| JP | 2005-203142 A | 7/2005 |
| JP | 2010-153284 A | 7/2010 |
| JP | 2013-140679 A | 7/2013 |

\* cited by examiner

ORGANIC ELECTROLUMINESCENCE DEVICE AND METHOD FOR MANUFACTURING ORGANIC ELECTROLUMINESCENCE DEVICE

TECHNICAL FIELD

The present invention relates to an organic electroluminescence device and a method for manufacturing the organic electroluminescence device.

Priority is claimed on Japanese Patent Application No. 2014-188144, filed Sep. 16, 2014, the content of which is incorporated herein by reference.

BACKGROUND ART

As one form of a display device, a self-luminous type display device such as an organic electroluminescence display device is known. Electroluminescence is abbreviated as "EL" below. In an organic EL display device, light emitted from a light-emitting layer travels in all directions, and a part of the light is totally reflected due to a difference in refractive index between a light-emitting element and an external space (air). Most of the light that is totally reflected at an interface between the light-emitting element and the air is confined within the light-emitting element and is not extracted to the external space. For example, if the refractive index of the light-emitting layer is 1.8, approximately 20% of light emitted from the light-emitting layer is extracted to the external space, and the remaining approximately 80% light is confined within the light-emitting layer. In this way, the conventional organic EL device has a problem of low light utilization efficiency.

Patent Document 1 discloses an organic EL display device which includes a support substrate, an organic EL element provided on the support substrate, and a light reflection layer which reflects light emitted from the organic EL element. In the organic EL display device, a recess including an inclined surface along an outer edge of the organic light-emitting layer is provided in the light reflection layer. The light emitted from the organic light-emitting layer returns toward the organic EL element after being reflected by the inclined surface of the recess. According to this configuration, deterioration of image quality such as bleeding can be prevented, and the light utilization efficiency can be improved.

In general, the emission spectrum of a light-emitting material tends to have a broad distribution over a broad wavelength range. Therefore, when high color purity is required, desired color purity may not be obtained in the spectrum originally possessed by the light-emitting material. As a technique for enhancing the color purity, there has been proposed a structure in which light emitted from the light-emitting layer is multiply reflected between a pair of reflection layers to resonance, that is, a so-called micro cavity structure. When the light resonates between the pair of reflection layers, there is an effect in which the emission spectrum becomes steep around the resonance wavelength, the light intensity of the peak wavelength increases, and the color purity is enhanced. For example, Patent Document 2 discloses an organic light-emitting display device which has a lower electrode, an upper electrode, and a dielectric alternate laminated film, and includes a micro-cavity structure including the dielectric alternate laminated film and the lower electrode.

PRIOR ART DOCUMENTS

Patent Documents

[Patent Document 1]
Japanese Patent Application Publication No. 2003-229283
[Patent Document 2]
Japanese Patent Application Publication No. 2010-153284

SUMMARY OF THE INVENTION

Problem to be Solved by the Invention

However, in the configuration of Patent Document 1, although the light utilization efficiency can be improved, the emitted light extracted at a predetermined angle is a combined light of light with various optical path lengths. Therefore, it is difficult to enhance the color purity by the micro-cavity effect. Further, in the configuration of Patent Document 2, since an effect is generated only on light emitted in a specific direction, particularly, in the forward direction, a viewing angle dependency occurs in improving the color purity and the luminance, and it is difficult to enhance the overall light extraction efficiency. In this way, although the light utilization efficiency and the color purity can be improved independently, it is difficult to improve both of them simultaneously. Here, problems have been explained using an organic EL display device as an example. However, this problem is not limited to the case in which a display device is used, and is also a common problem when a lighting device is used.

An aspect of the present invention is an organic EL device and a method for manufacturing an organic EL device which are excellent in both light utilization efficiency and color purity.

Means for Solving the Problems

An organic EL device according to one aspect of the present invention including: a base material; a first structure section provided on the base material; and a second structure section provided on the substrate, wherein the first structure section including: a recess provided in the base material; a reflection layer provided along a surface of the recess; a filling layer having light transmissivity filled in the recess via the reflection layer; a first electrode having light transmissivity provided on an upper layer side of the filling layer; an organic layer including a light-emitting layer provided on an upper layer side of the first electrode; and a second electrode having light transmissivity and light reflectivity provided on an upper layer side of the organic layer, wherein the second structure section includes: a reflection layer provided on a flat surface of the base material; a first electrode having light transmissivity provided on an upper layer side of the reflection layer; an organic layer including a light-emitting layer provided on an upper layer side of the first electrode; and a second electrode having light transmissivity and light reflectivity provided on an upper layer side of the organic layer.

The second structure section may have a micro-cavity structure.

A part of the reflection layer and a part of the first electrode may be in contact with each other at an end portion of the first structure section.

In the first structure section, a lower surface of the first electrode at a position of the recess may be located lower than a plane including the flat surface.

A lower surface of the light-emitting layer at a position of the recess may be located lower than the flat surface.

The second electrode may be made of a metal film.

A cross-sectional shape of the recess cut by an arbitrary plane perpendicular to the flat surface may be a circular arc shape.

The first electrode may be provided in contact with an upper surface of the filling layer, and a refractive index of the filling layer may be substantially equal to a refractive index of the first electrode.

A refractive index of the filling layer may be substantially equal to a refractive index of the light-emitting layer.

The reflection layer may be made of a dielectric multi-layer film.

The reflection layer may have light scattering properties.

The organic EL device according to one aspect of the present invention may include: a plurality of unit light-emitting regions, wherein the plurality of unit light-emitting regions may include: a first unit light-emitting region having the second structure section in which an area ratio per unit area to the first structure section is at least 21.5%, and a second unit light-emitting region having the second structure section.

An area of the first unit light-emitting region and an area of the second unit light-emitting region may be different from each other.

The first unit light-emitting region and the second unit light-emitting region may be capable of being driven independently of each other.

Only one of the first unit light-emitting region and the second unit light-emitting region may be capable of emitting light.

A current supplied to the first unit light-emitting region and a current supplied to the second unit light-emitting region may be different from each other.

A waveform of a current supplied to the first unit light-emitting region and a waveform of a current supplied to the second unit light-emitting region may be pulse waveforms.

A pulse waveform in the first unit light-emitting region and a pulse waveform in the second unit light-emitting region may be different from each other.

A frequency of the pulse waveform may be 60 Hz or more.

A method for manufacturing an organic electroluminescence device according to one aspect of the present invention includes: a step of forming a recess in a base material; a step of forming a reflection layer over a surface of the recess and a flat surface of the base material; a step of forming a filling layer having light transmissivity inside the recess via the reflection layer; a step of forming a first electrode having light transmissivity on an upper layer side of the filling layer, in a first structure section including the recess, and forming the first electrode on an upper layer side of the reflection layer, in a second structure section corresponding to the flat surface of the base material; a step of forming an organic layer including a light-emitting layer on an upper layer side of the first electrode; and a step of forming a second electrode having light transmissivity and light reflectivity on an upper layer side of the organic layer.

Effect of the Invention

According to an embodiment of the present invention, it is possible to achieve an organic EL device that is excellent in both light utilization efficiency and color purity.

BRIEF DESCRIPTIONS OF THE DRAWINGS

FIGS. 5(A) to 5(D) are cross-sectional views representing a manufacturing process of the organic EL device.

Figure 5:
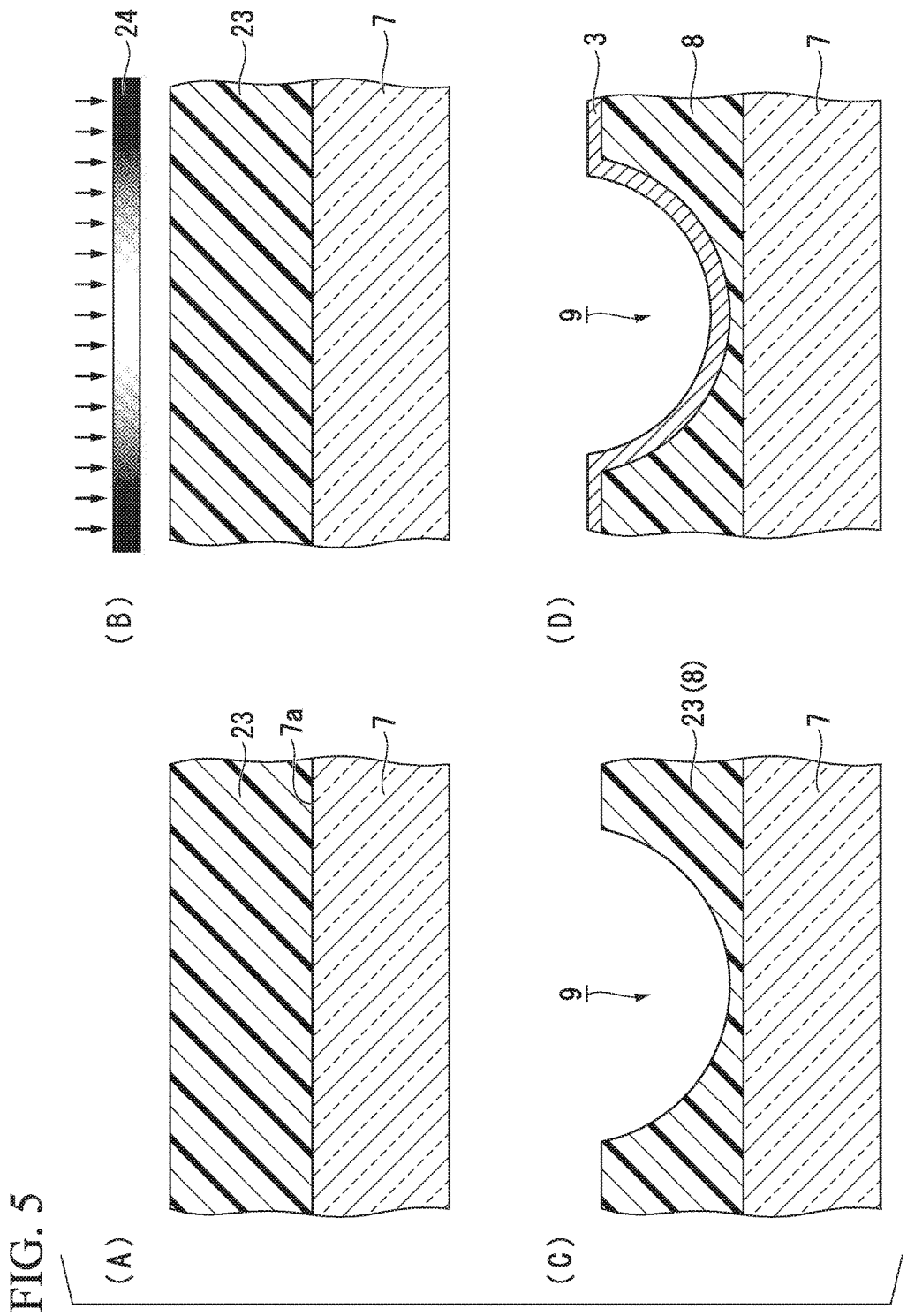
Figure 6:
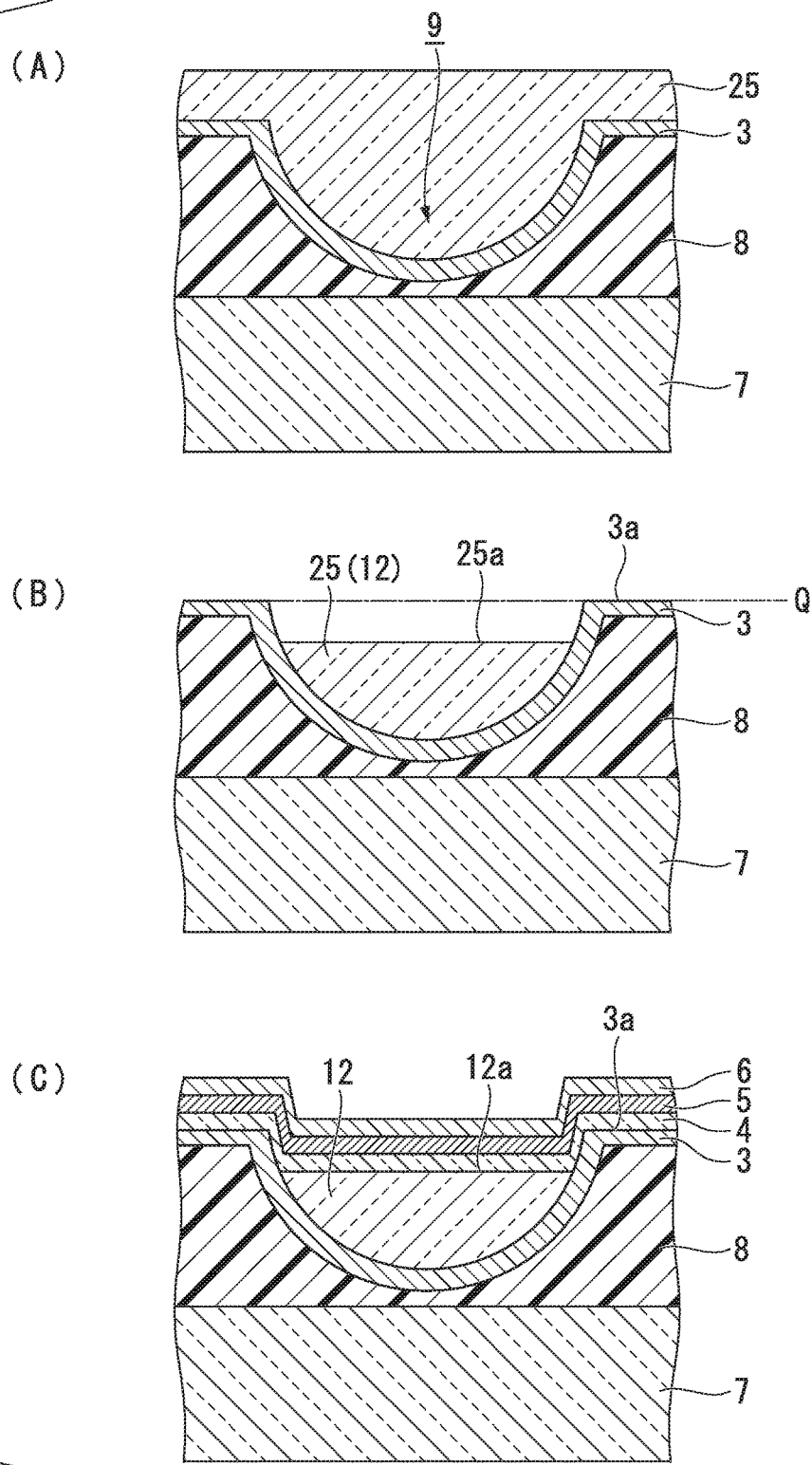
Figure 7:
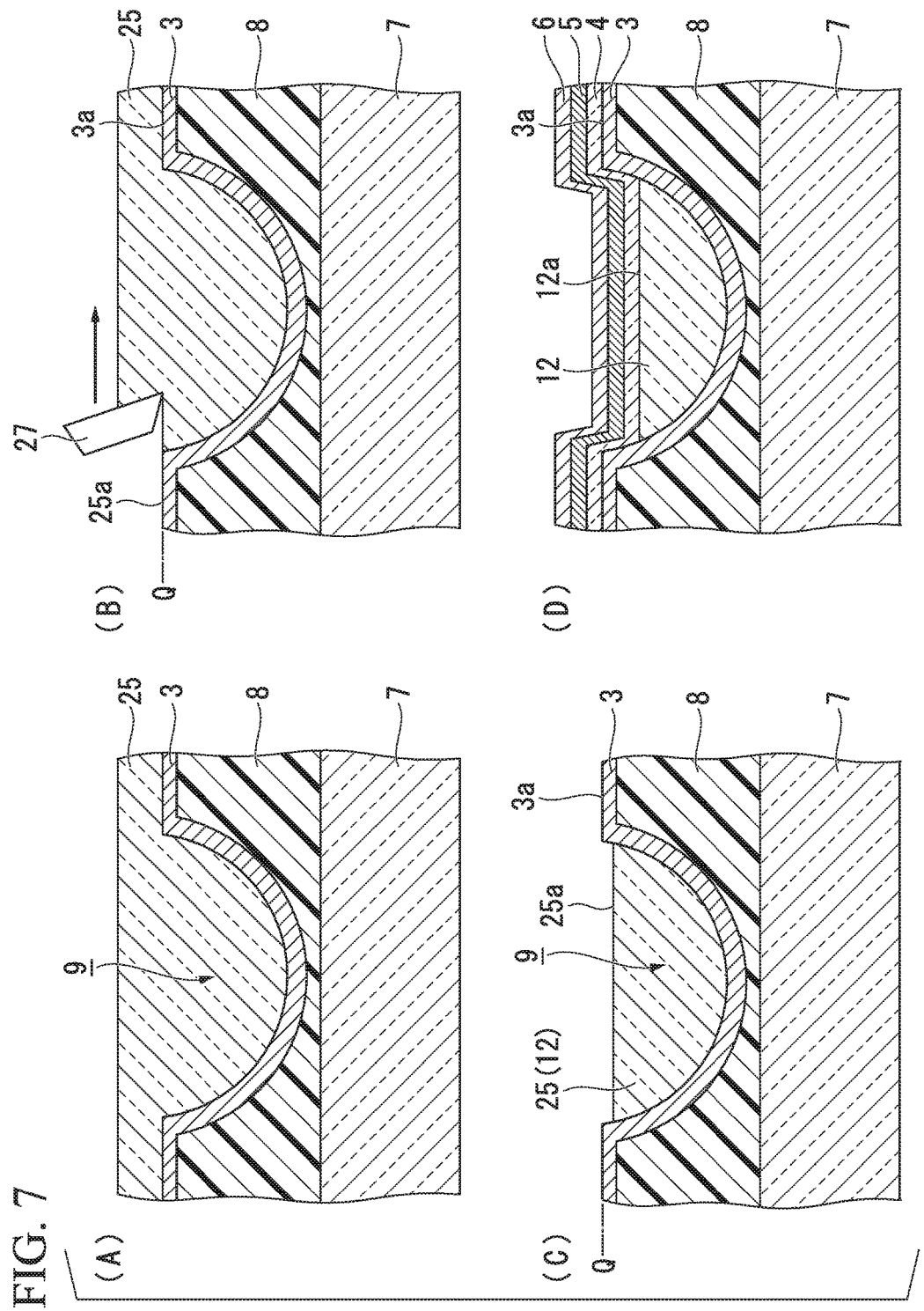

FIGS. 6(A) to 6(C) are cross-sectional views representing a first example of a manufacturing process following the manufacturing process of FIG. 5.

FIGS. 7(A) to 7(D) are cross-sectional views representing a second example of the manufacturing process following the manufacturing process of FIG. 5.

Figure 8:
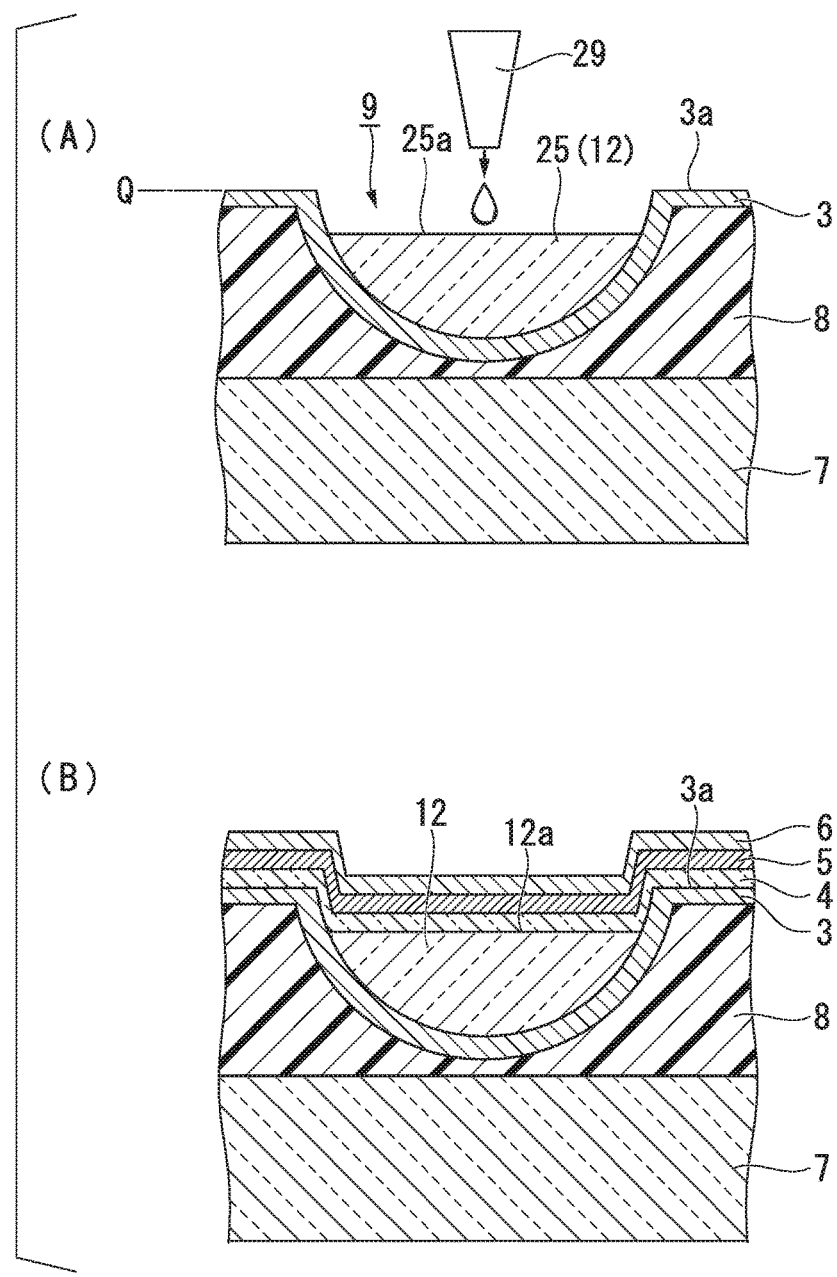

FIGS. 8(A) and 8(B) are cross-sectional views representing a third example of the manufacturing process following the manufacturing process of FIG. 5.

Figure 9:
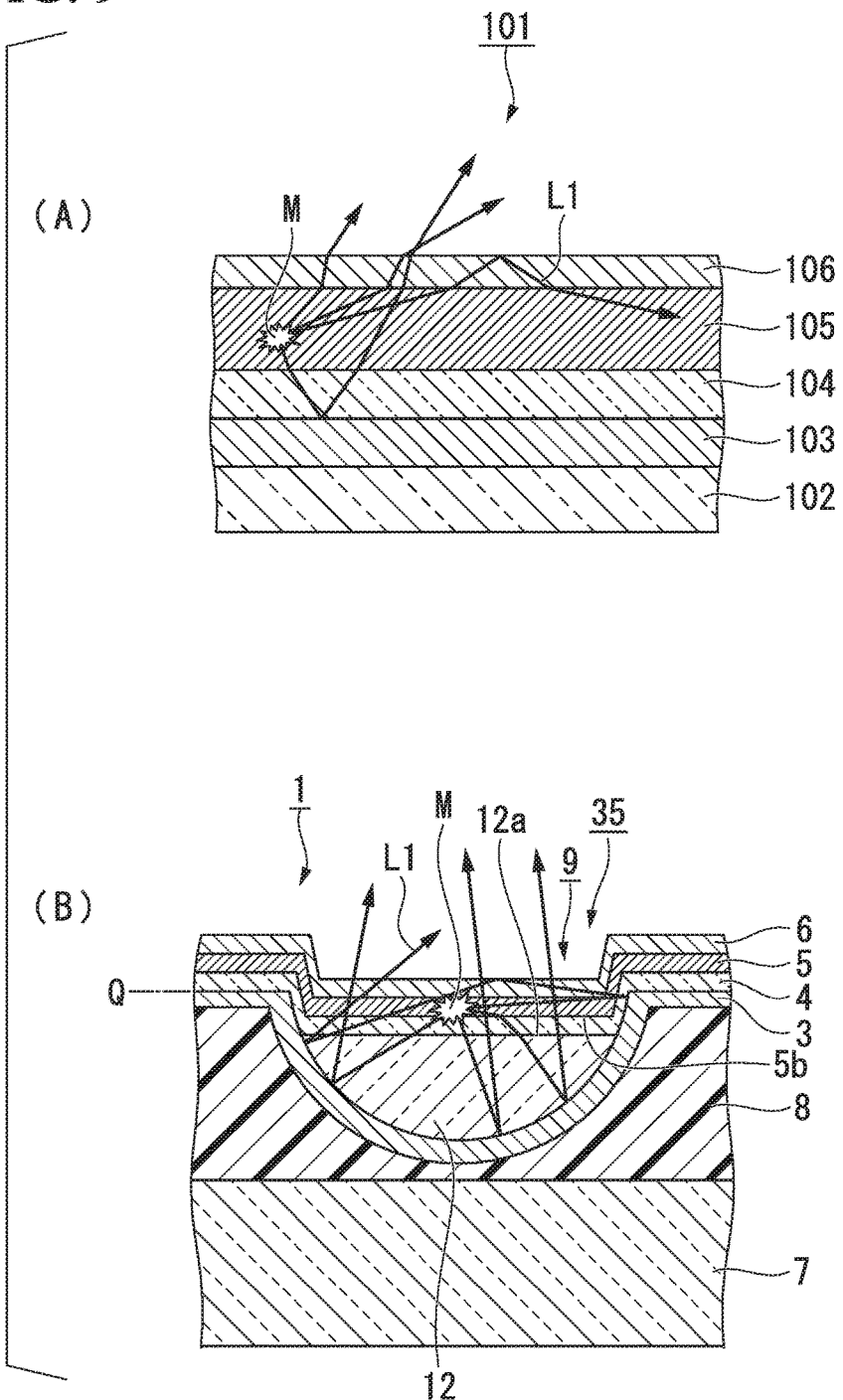

FIG. 9(A) is a cross-sectional view for describing the problem of the conventional organic EL device, and FIG. 9(B) is a cross-sectional view for describing the operation of the organic EL device of the present embodiment.

Figure 10:
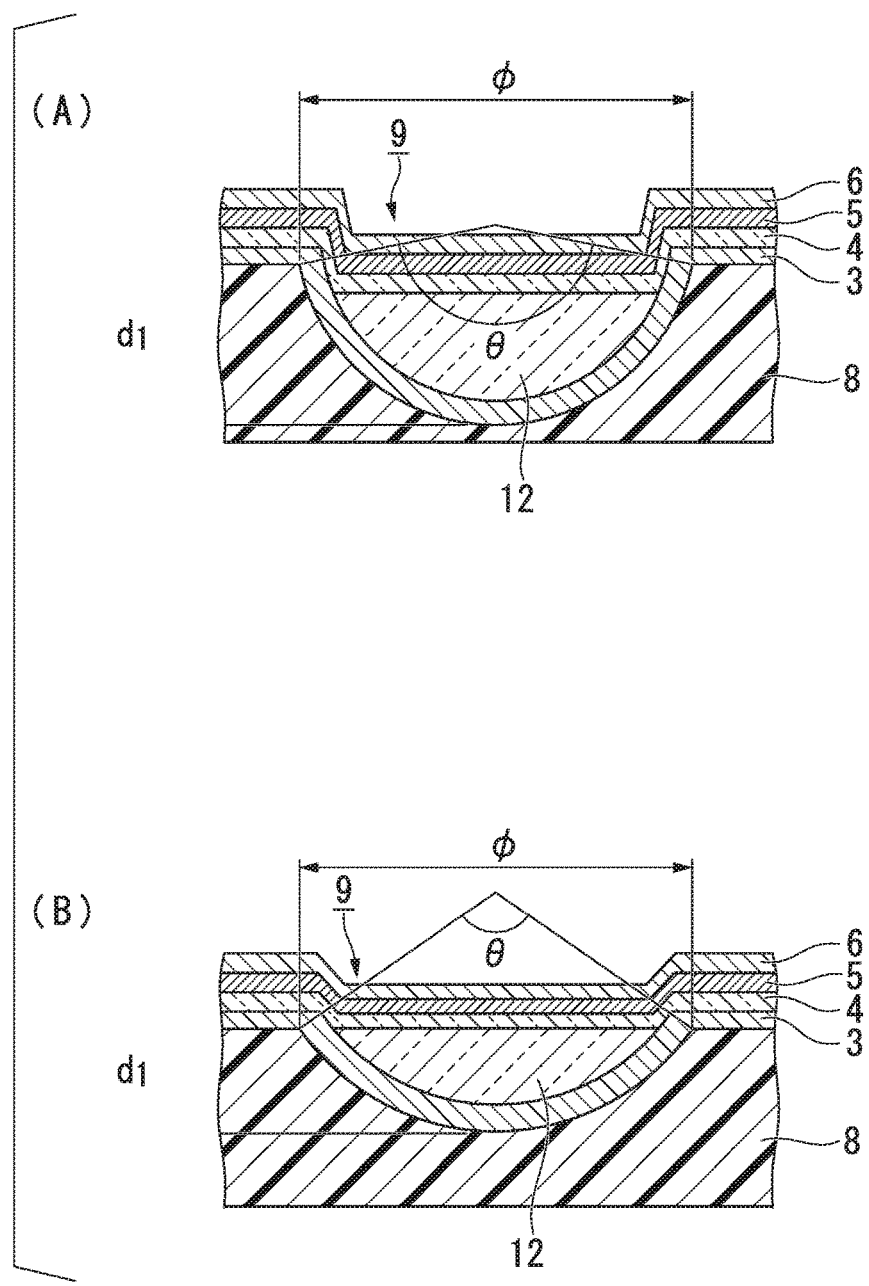

FIGS. 10(A) and 10(B) are diagrams for describing parameters representing the depth of a recess.

Figure 11:
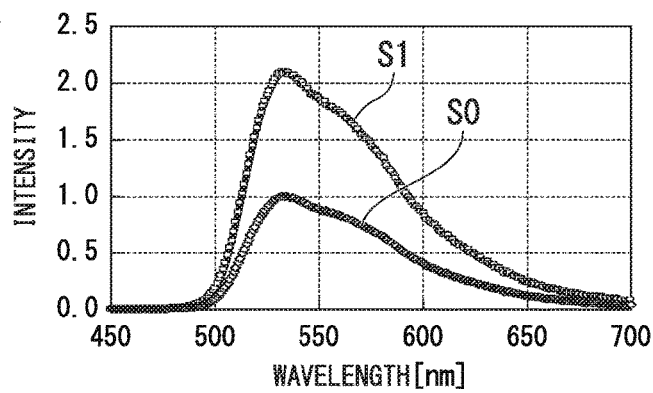

FIG. 11 is a graph for describing the effect of the first structure section, and representing a relationship between the wavelength and the intensity.

Figure 12:
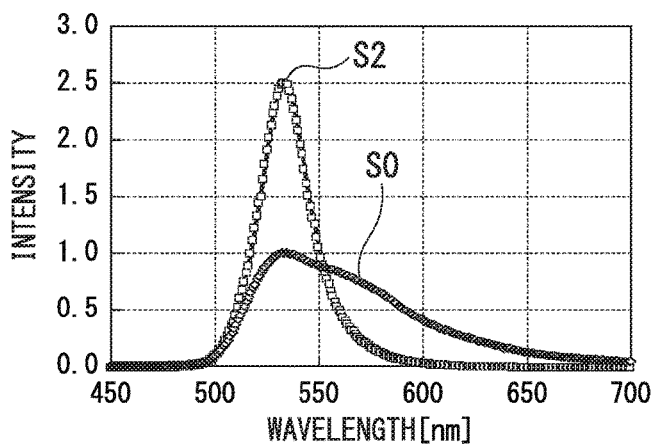

FIG. 12 is a graph for describing the effect of the second structure section, and representing a relationship between the wavelength and the intensity.

Figure 13:
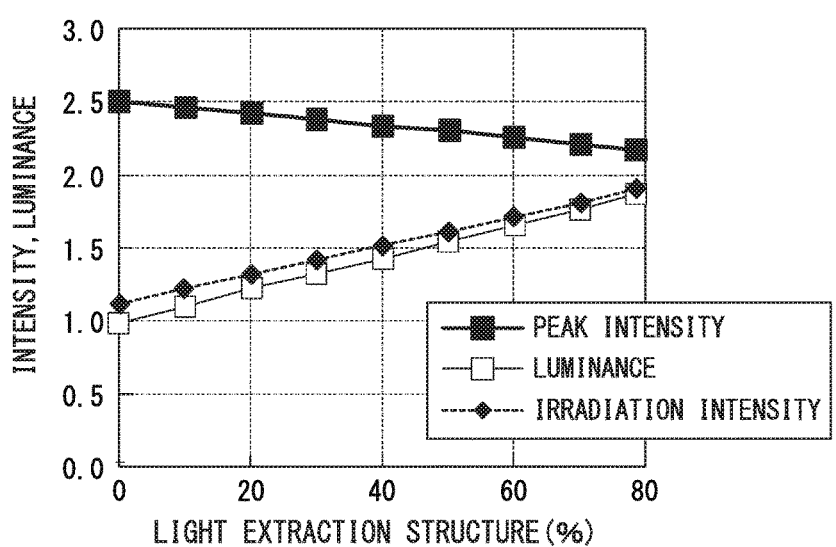

FIG. 13 is a graph representing a relationship between an installation ratio and strength of the first structure section.

Figure 14:
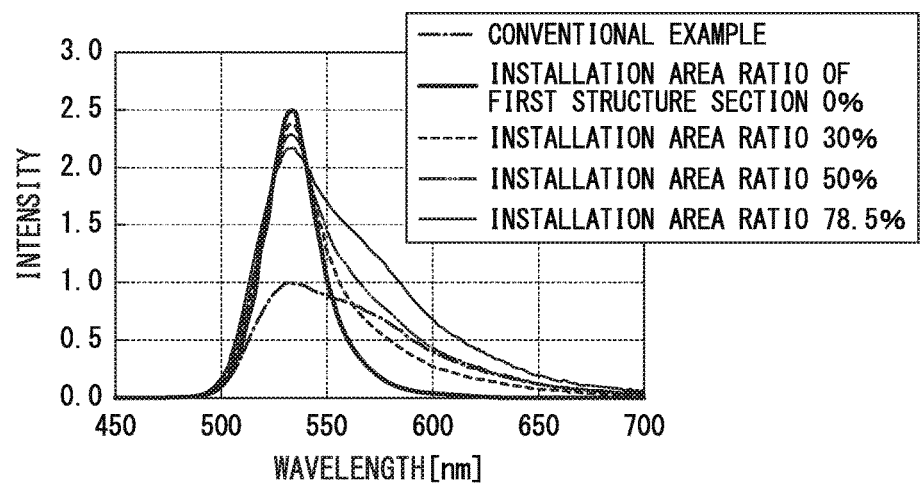

FIG. 14 is a graph representing a relationship between the wavelength and the intensity when the installation ratio of the first structure section changes.

Figure 15:
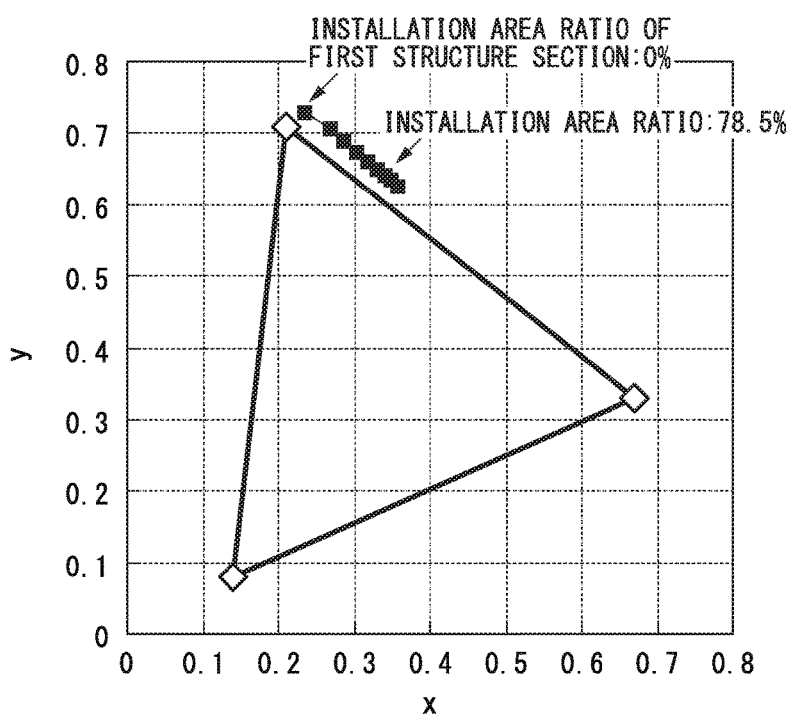

FIG. 15 is a diagram representing a change in chromaticity coordinates when the installation ratio of the first structure section changes.

Figure 16:
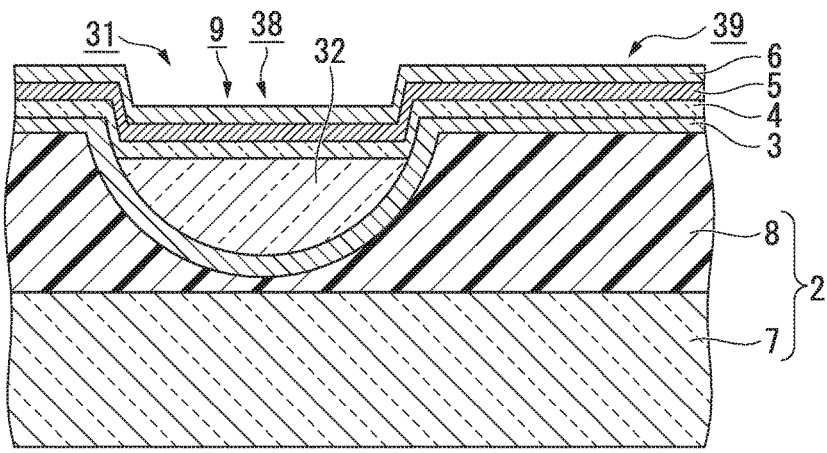

FIG. 16 is a cross-sectional view representing the organic EL device of a second embodiment.

Figure 17:
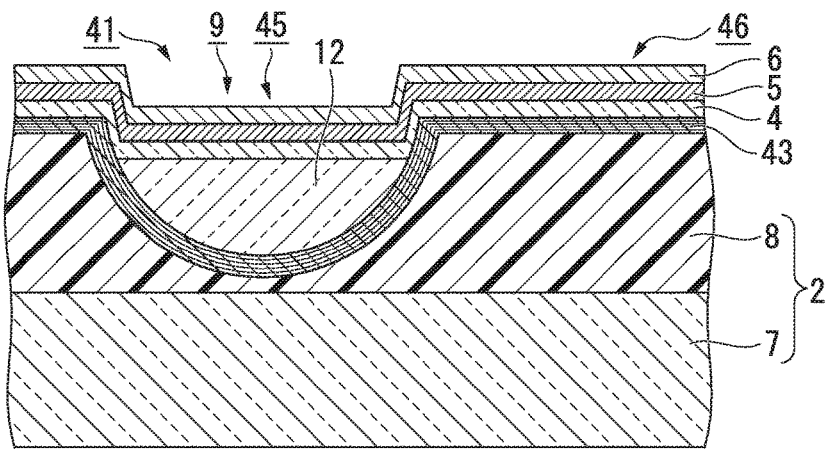

FIG. 17 is a cross-sectional view representing an organic EL device according to a third embodiment.

Figure 18:
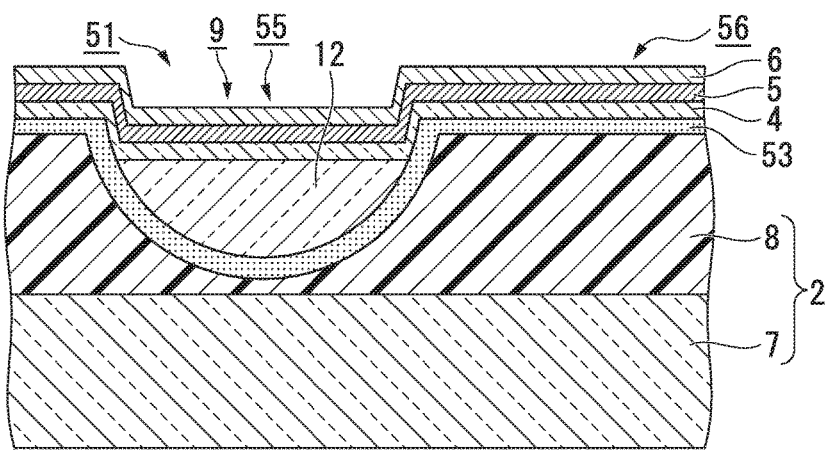

FIG. 18 is a cross-sectional view representing an organic EL device according to a fourth embodiment.

Figure 19:
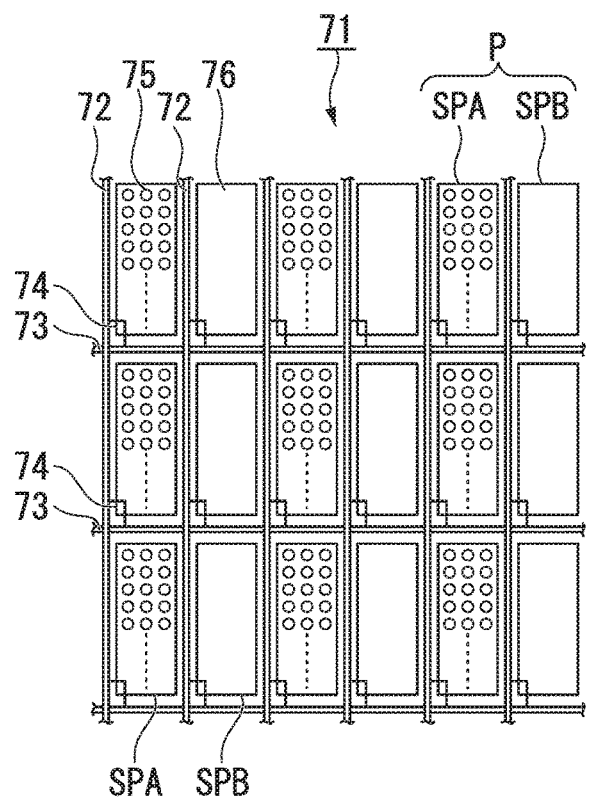

FIG. 19 is a plan view representing an organic EL device according to a fifth embodiment.

Figure 20:
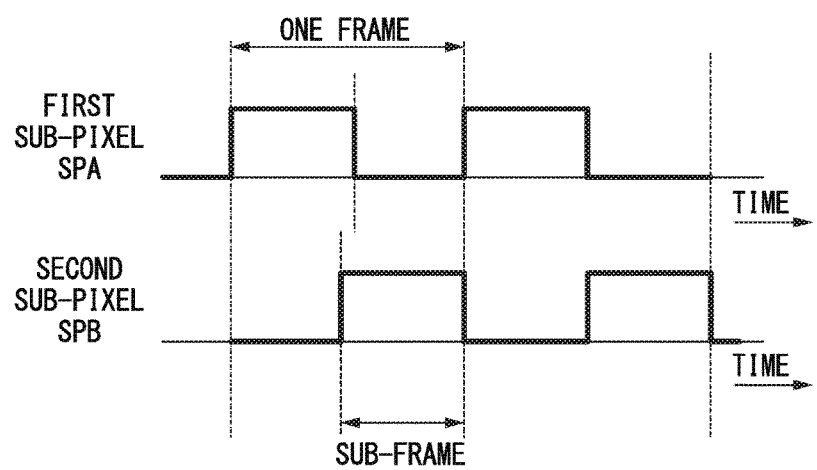

FIG. 20 is a diagram representing current waveforms supplied to each sub-pixel in the organic EL device of a sixth embodiment.

Figure 21:
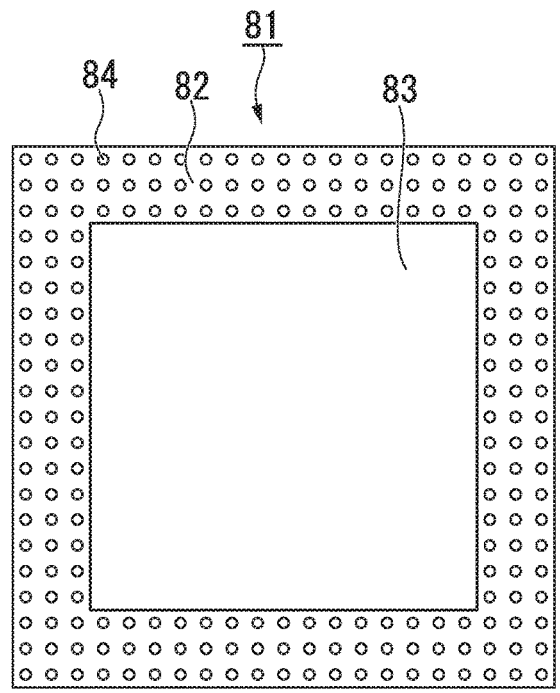

FIG. 21 is a plan view representing an organic EL device according to a seventh embodiment.

Figure 22:
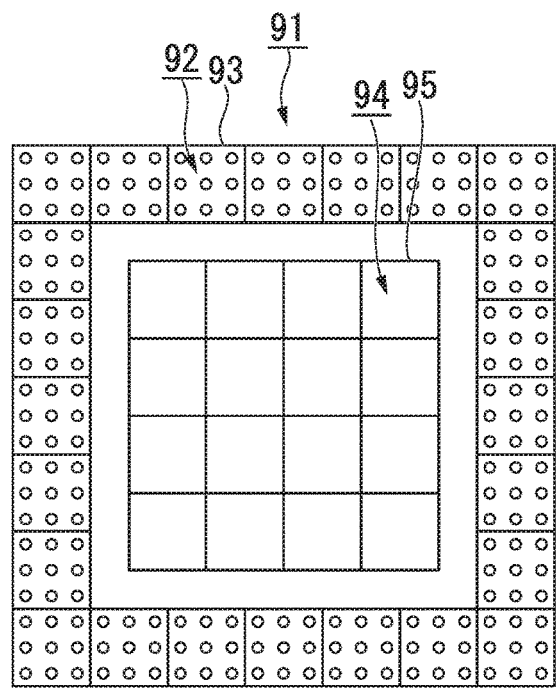

FIG. 22 is a plan view representing a modified example of the organic EL device of the seventh embodiment.

EMBODIMENTS FOR CARRYING OUT THE INVENTION

First Embodiment

Hereinafter, a first embodiment of the present invention will be described with reference to FIGS. 1 to 15.

An organic EL device of the first embodiment is an example of a top emission type organic EL device which adopts a micro-cavity structure.

Figure 1:
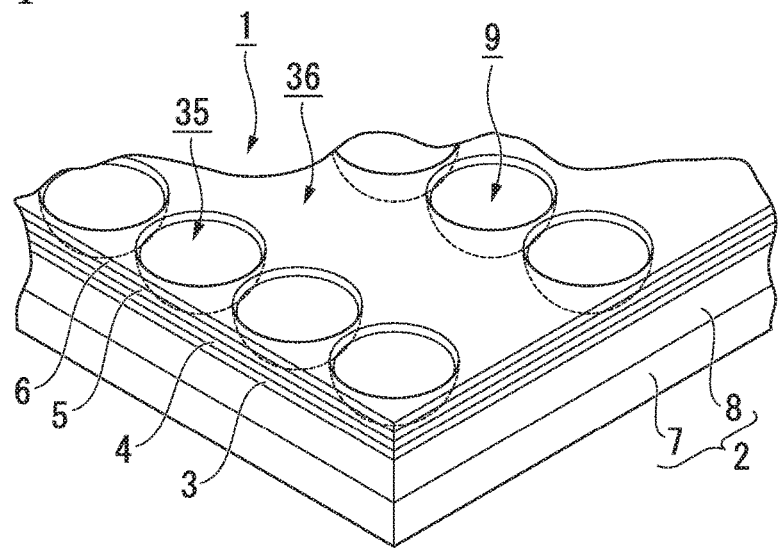
FIG. 1 is a perspective view representing an organic EL device according to a first embodiment.

FIG. 1 is a perspective view of the organic EL device of the first embodiment.

In the following drawings, in order to make each component easy to see, the scales of the dimensions may be differently represented depending on the constituent elements.

As represented in FIG. 1, an organic EL device 1 of the present embodiment includes a base material 2, a reflection layer 3, a first electrode 4, an organic layer 5 including a light-emitting layer, and a second electrode 6. The organic EL device 1 is a top emission type organic EL device, and light emitted from the light-emitting layer is emitted from the side of the second electrode 6. The base material 2 includes a substrate 7 and a ground layer 8. The ground layer 8, the reflection layer 3, the first electrode 4, the organic layer 5, and the second electrode 6 are laminated on the upper surface of the substrate 7, in this order from the substrate 7 side. A plurality of recesses 9 are provided on an upper surface (light emission surface) of the organic EL device 1.

The organic EL device 1 of the present embodiment is, for example, a green light-emitting element which emits green light. In addition, the organic EL device 1 may be a red light-emitting element that emits red light or a blue light-emitting element that emits blue light. The green light-emitting element, the red light-emitting element, and the blue light-emitting element differ only in the constituent material of the light-emitting layer, and other configurations are common. Further, for example, the organic EL device 1 may simultaneously emit red light, green light, and blue light. In this case, the organic EL device 1 can be used as, for example, a lighting device that emits white light. However, the application of the organic EL device 1 is not limited to the lighting device. For example, the organic EL device 1 may be applied to a display device in which each of the red light-emitting element, the green light-emitting element, and the blue light-emitting element is miniaturized to be a red sub-pixel, a green sub-pixel, and a blue sub-pixel, and one display pixel is formed of the three sub-pixels.

Figure 2:
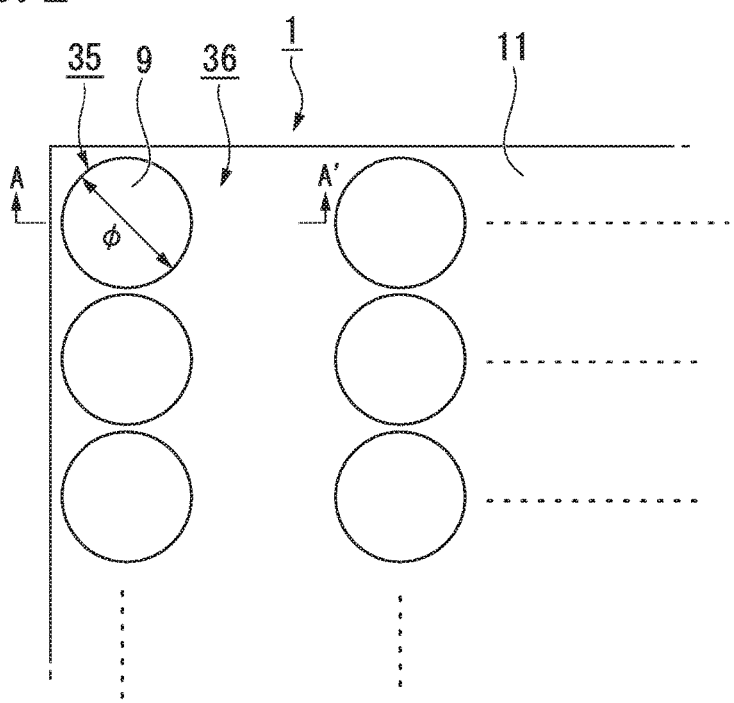
FIG. 2 is a plan view of the organic EL device.

FIG. 2 is an enlarged plan view representing a part of the organic EL device 1.

When viewed from a normal direction of the upper surface of the organic EL device 1, a planar shape of the organic EL device 1 is a square, and the length of one side of the square is, for example, about 2 mm.

As represented in FIG. 2, the organic EL device 1 includes the base material 2, a first structure section 35 provided on the base material 2, and a second structure section 36 provided on the base material 2. The first structure section 35 has a plurality of recesses 9 having a circular planar shape. The second structure section 36 does not have the recess 9 and has a flat surface. The diameter φ of the recess 9 is, for example, about 5 μm. The plurality of recesses 9 are regularly disposed in the vertical and horizontal directions. The plurality of recesses 9 are disposed in close proximity to each other in the vertical direction, and are disposed apart from each other by a distance equal to or larger than the diameter φ of the recess 9 in the horizontal direction. A ratio of a total area of the plurality of recesses 9 to an area of the entire organic EL device 1 is set to a predetermined value. The ratio of the total area of the plurality of recesses 9 to the area of the entire organic EL device 1 is hereinafter referred to as an installation area ratio of the first structure section 35. A difference in effects when the installation area ratio of the first structure section 35 is changed will be described later.

Figure 3:
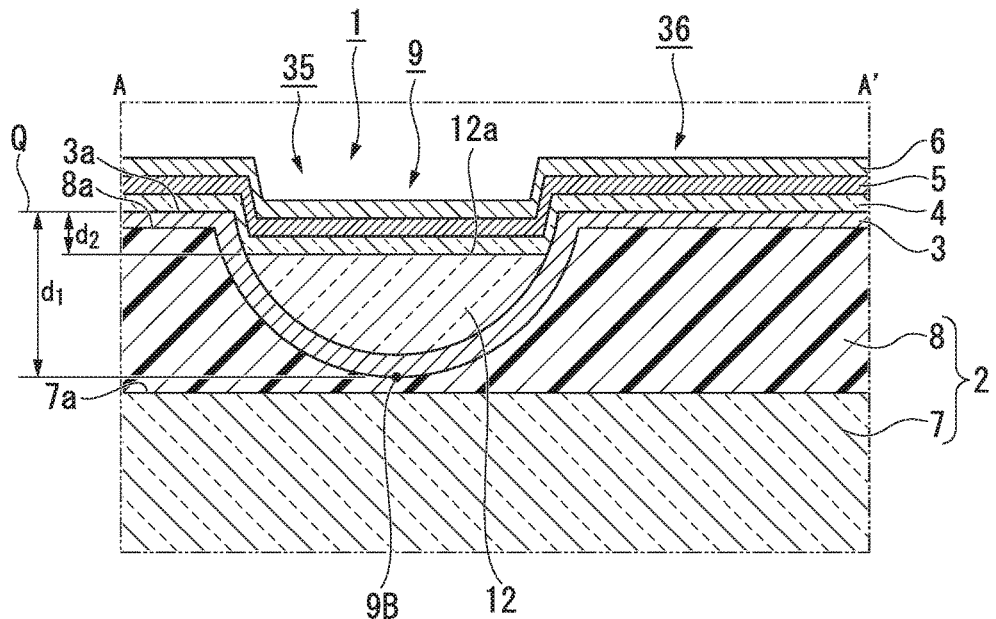
FIG. 3 is a cross-sectional view taken along a line A-A' of FIG. 2.

FIG. 3 is a cross-sectional view of the organic EL device 1 taken along an arbitrary plane perpendicular to the upper surface of the base material 2, and is a cross-sectional view taken along a line A-A' of FIG. 2.

As represented in FIG. 3, a ground layer 8 is laminated on a first surface 7a (upper surface) of the substrate 7. As the substrate 7, for example, a glass substrate is used. Since the organic EL device 1 is a top emission type organic EL device, the substrate 7 does not necessarily have light permeability, and for example, a semiconductor substrate such as a silicon substrate may be used.

A recess 9 that opens toward the top is provided on a part of a first surface 8a (upper surface) of the ground layer 8. A region of the first surface 8a of the ground layer 8 other than a region in which the recess 9 is provided is a flat surface. The cross-sectional shape of the recess 9 is a circular arc shape. That is, the inner surface of the recess 9 forms a part of a spherical surface in three dimensions. The ground layer 8 is made of a photosensitive resin, for example, a resin such as acrylic, epoxy or polyimide. When a photosensitive resin is used as the material of the ground layer 8, it is suitable for a method for forming the recess 9 to be described later. However, when a method other than the forming method to be described later is adopted, the constituent material of the ground layer 8 may not necessarily have photosensitivity. Further, the constituent material of the ground layer 8 may not be a resin and may be an inorganic material. In the present embodiment, although the base material 2 made of the substrate 7 and the ground layer 8 is used, it is not always necessary to use the ground layer, and the recess may be formed in the substrate 7 itself.

The reflection layer 3 is formed on the first surface 8a of the ground layer 8 including the inner surface of the recess 9. As the constituent material of the reflection layer 3, a highly reflective metal such as aluminum or silver is preferably used. In the case of the present embodiment, the reflection layer 3 is made of, for example, an aluminum film having a film thickness of 100 nm.

A filling layer 12 is filled inside the recess 9 via the reflection layer 3. The upper surface 12a of the filling layer 12 is located lower than a plane Q including the flat surface 3a of the reflection layer 3. The height from the upper surface 12a of the filling layer 12 to the flat surface 3a of the reflection layer 3 is set as d2. In the case of the present embodiment, the height d2 is set to, for example, 0.1 mm. The height from a bottom 9B of the recess 9 to the flat surface 3a of the reflection layer 3 is set as d1. A specific example of the height d1 will be described later.

The upper surface 12a of the filling layer 12 is preferably located lower than the plane Q including the flat surface 3a of the reflection layer 3. However, even when the upper surface 12a of the filling layer 12 is located at the highest position, it needs to be at the same height as the plane Q. In other words, the filling layer 12 is not formed to protrude above the plane Q. The filling layer 12 is made of a resin having light transmissivity. Specifically, as the material of the filling layer 12, for example, a resin such as acrylic, epoxy or polyimide is used. The refractive index of the filling layer 12 of this embodiment is, for example, 1.5.

The first electrode 4 is formed over the upper surface 12a of the filling layer 12 and the flat surface 3a of the reflection layer 3. The first electrode 4 has a step in the edge portion of the recess 9. A portion of the first electrode 4 located on the first surface 8a of the ground layer 8 is in contact with a part of the reflection layer 3. At the position inside the recess 9, the lower surface of the first electrode 4 is in contact with the upper surface 12a of the filling layer 12. Therefore, the lower surface of the first electrode 4 is located lower than the plane Q including the flat surface 3a of the reflection layer 3. The first electrode 4 is a transparent electrode made of a transparent conductive film such as indium tin oxide (ITO) or indium zinc oxide (IZO), and has light transmissivity. In the case of this embodiment, the first electrode 4 is made of, for example, ITO having a film thickness of 120 nm. The first electrode 4 functions as an anode for injecting holes into the organic layer.

The organic layer 5 is laminated along the upper surface of the first electrode 4. The organic layer 5 reflects the shape of the first electrode 4 and has a step on the edge portion of the recess 9. The organic layer 5 is a laminated body made of an organic material including a hole injection layer, a hole transport layer, a light-emitting layer, an electron transport layer, and an electron injection layer. The lower surface of the organic layer 5 is located lower than the plane Q including the flat surface 3a of the reflection layer 3. The detailed configurations and functions of each layer constituting the organic layer 5 will be described later.

The second electrode 6 is laminated along the upper surface of the organic layer 5. The second electrode 6 reflects the shape of the organic layer 5 and has a step in the edge portion of the recess 9. The second electrode 6 is a translucent electrode made of, for example, a metal thin film such as silver or a magnesium silver alloy. That is, the second electrode 6 has both light transmissivity and light reflectivity, transmits a part of the incident light, and reflects the rest. As the second electrode 6, a metal having a small work function is suitably used. For example, Ag, Al, a magnesium alloy (MgAg or the like), an aluminum alloy (AlLi, AlCa, AlMg or the like) or the like is used. In the case of the present embodiment, the second electrode 6 is made of a laminated film of, for example, a MgAg alloy having a film thickness of 1 nm and Ag having a film thickness of 19 nm. The second electrode 6 functions as a cathode for injecting electrons into the organic layer 5. Further, although not represented in FIG. 3, an optical adjustment layer called a cap layer is laminated on the upper surface of the second electrode 6.

As described above, the formation region of the recess 9 corresponds to the first structure section 35 (the left side in FIG. 3), and the flat portion which is a non-formation region of the recess 9 corresponds to the second structure section 36 (the right side in FIG. 3).

The first structure section 35 includes the recess 9, the reflection layer 3, the filling layer 12, the first electrode 4, the organic layer 5 including the light-emitting layer, and the second electrode 6 provided in the base material 2. The reflection layer 3 is provided along the inner surface of the recess 9. The filling layer 12 is filled inside the recess 9 via the reflection layer 3. The first electrode 4 has light transmissivity and is provided on the upper layer side of the filling layer 12. The organic layer 5 including the light-emitting layer is provided on the upper layer side of the first electrode 4. The second electrode 6 has light transmissivity and light reflectivity, and is provided on the upper layer side of the organic layer 5.

The second structure section 36 includes the reflection layer 3, the first electrode 4, the organic layer 5 including the light-emitting layer and the second electrode 6 provided on the flat surface of the base material 2. The first electrode 4 has light transmissivity and is provided on the upper layer side of the reflection layer 3. The organic layer 5 including the light-emitting layer is provided on the upper layer side of the first electrode 4. The second electrode 6 has light transmissivity and light reflectivity, and is provided on the upper layer side of the organic layer 5. As described above, the reflection layer 3, the first electrode 4, the organic layer 5, and the second electrode 6 of the first structure section 35 are integrated with the reflection layer 3, the first electrode 4, the organic layer 5 and the second electrode 6 of the second structure section 36, respectively.

The second structure section 36 has a micro-cavity structure. The micro-cavity structure includes a region sandwiched between the reflection layer 3 and the second electrode 6. Light emitted from the light-emitting layer is multiply reflected between the reflection layer 3 and the second electrode 6. At this time, a specific wavelength component of the light emitted from the light-emitting layer is strengthened.

Figure 4:
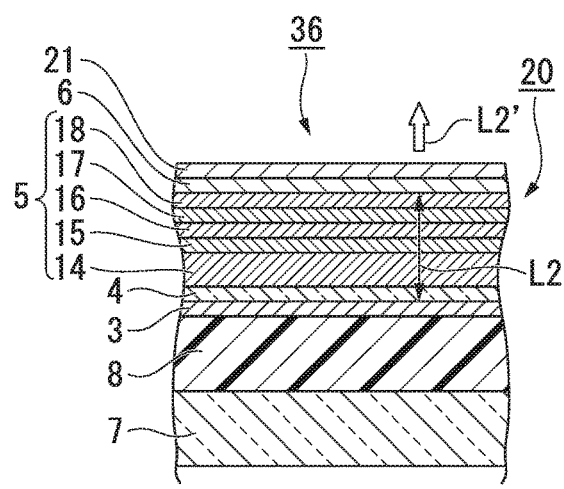
FIG. 4 is a cross-sectional view representing a detailed configuration of a second structure section.

FIG. 4 is a cross-sectional view representing the detailed configuration of the organic layer 5. In FIG. 4, the organic layer 5 in the second structure section 36 (flat portion) is illustrated.

As represented in FIG. 4, the organic layer 5 is provided on the upper layer of the first electrode 4. The organic layer 5 is formed of a laminated film in which the hole injection layer 14, the hole transport layer 15, the light-emitting layer 16, the electron transport layer 17 and the electron injection layer 18 are laminated in this order from the first electrode 4 side. However, layers other than the light-emitting layer 16 may be appropriately inserted as necessary. In addition, the transport layer and the injection layer may also serve as a single layer.

In the present embodiment, an organic layer having a five-layer structure of the hole injection layer 14, the hole transport layer 15, the light-emitting layer 16, the electron transport layer 17 and the electron injection layer 18 has been described above as an example. Further, if necessary, a layer for preventing movement of charges to the opposite electrode, such as a hole blocking layer or an electron blocking layer, may be appropriately added.

The hole injection layer 14 is a layer having a function of enhancing the hole injection efficiency from the first electrode 4 to the light-emitting layer 16. As the material of the hole injection layer 14, for example, benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene or a derivative thereof, or a heterocyclic conjugated monomer such as a polysilane compound, a vinylcarbazole compound, a thiophene compound or an aniline compound, oligomer or polymer, and the like are used, and these organic materials are mixed with molybdenum oxide. The mixing ratio of the organic material and the molybdenum oxide is, for example, the organic material at about 80% and the molybdenum oxide at about 20%. The thickness of the hole injection layer 14 is, for example, about 70 nm.

The hole transport layer 15 is a layer having a function of enhancing the hole transport efficiency from the first electrode 4 to the light-emitting layer 16. As the hole transport layer 15, the same organic material used for the hole injection layer 14 is used. Further, the hole injection layer 14 and the hole transport layer 15 may be integrated with each other or may be formed as independent layers. The thickness of the hole transport layer 15 is, for example, about 10 nm.

The light-emitting layer 16 has a function of recombining holes injected from the first electrode 4 side and electrons injected from the second electrode 6 side and emitting light when deactivating energy. The material of the light-emitting layer 16 is made of, for example, a host material and a dopant material. Further, an assist material may be included. The host material is contained at the highest proportion among the constituent materials in the light-emitting layer 16. For example, the mixing ratio of the host material and the dopant material is the host material at about 90% and the dopant material at about 10%. The host material has a function of facilitating film formation of the light-emitting layer 16 and maintaining the light-emitting layer 16 in a film state. Therefore, the host material is required to be a stable compound in which crystallization does not easily occur and a chemical change does not easily occur after the film formation. Further, when an electric field is applied between the first electrode 4 and the second electrode 6, carriers are recombined in the host molecule, and a function of moving the excitation energy to the dopant material to cause the dopant material to emit light is exhibited. In this embodiment, a bipolar material is used as the host material and a phosphorescent material is used as the dopant material. The thickness of the light-emitting layer 16 is, for example, about 60 nm.

As a specific material of the light-emitting layer 16, a material including a material having a high luminous efficiency such as a low molecular fluorescent dye, a fluorescent polymer or a metal complex can be adopted. The material of the light-emitting layer 16 includes, for example, anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene or derivatives thereof, tris(8-quinolinolato)aluminum complex, bis(benzoquinolinolato)beryllium complex, tri(dibenzoylmethyl)phenanthroline europium complex, ditoluylvinylbiphenyl and the like.

The electron transport layer 17 has a function of enhancing the electron transport efficiency from the second electrode 6 to the light-emitting layer 16. The material of the electron transport layer 17 includes, for example, quinoline, perylene, phenanthroline, bisstyryl, pyrazine, triazole, oxazole, oxadiazole, fluorenone, and derivatives or metal complexes thereof. Specifically, tris(8-hydroxyquinoline) aluminum, anthracene, naphthalene, phenanthrene, pyrene, anthracene, perylene, butadiene, coumarin, acridine, stilbene, 1,10-phenanthroline or derivatives or metal complexes thereof are used. The thickness of the electron transport layer 17 is, for example, about 15 nm.

The electron injection layer 18 has a function of enhancing the electron injection efficiency from the second electrode 6 to the light-emitting layer 16. As a material of the electron injection layer 18, for example, a compound such as metallic calcium (Ca) and lithium fluoride (LiF) is used. Further, the electron transport layer 17 and the electron injection layer 18 may be integrated with each other or may be formed as independent layers. The thickness of the electron injection layer 18 is, for example, about 0.5 nm.

A cap layer 21 is laminated on the upper surface of the second electrode 6. The cap layer 21 functions as a protective layer for protecting the second electrode 6 and also functions as an optical adjustment layer. Note that a color filter may be added to the upper layer side of the second electrode 6. Light emitted from the organic layer 5 passes through the color filter, thereby further improving color purity.

An example of a specific configuration of the organic EL device 1 is, for example, as represented in Table 1.

TABLE 1

| Anode | ITO: 120 nm |
|---|---|
| Hole injection layer | Organic HTL material (80%): MoOx (20%) 70 nm |

TABLE 1-continued

| Hole transport layer | Organic HTL material 10 nm |
|---|---|
| Light-emitting layer | H (90%): d (10%) 60 nm H: bipolar material d: dopant material |
| Electron transport layer | Organic ETL material 15 nm |
| Electron injection layer | LiF 0.5 nm |
| Cathode | MgAg 1 nm/Ag 19 nm |
| Cap layer | 78 nm |

Light-emitting layer H (host material), d (dopant material)

Hereinafter, the manufacturing process of the organic EL device 1 having the aforementioned configuration will be described with reference to FIGS. 5 to 8.

In particular, the method for forming the recess 9 will be mainly described.

First, as represented in FIG. 5(A), a positive photosensitive resin material is applied onto the first surface 7a of the substrate 7 to form a resin layer 23.

Next, as represented in FIG. 5(B), the resin layer 23 is exposed via a photomask 24.

At this time, as in the case of a gray-tone mask, a photomask 24 having a predetermined light transmission quantity distribution, specifically, a mask 24, in which the light transmission quantity in the vicinity of the center of a circular pattern is large, and the light transmission quantity decreases toward the peripheral portion, is used. Thus, in the resin layer 23, the exposure quantity in the vicinity of the center of the circular pattern is large, and the exposure quantity decreases toward the periphery.

Next, as represented in FIG. 5(C), development of the resin layer 23 is performed using a predetermined developer. At this time, depending on the difference in the exposure quantity of the resin layer 23, the film reduction quantity of the resin layer 23 increases in the vicinity of the center of the circular pattern and decreases toward the peripheral portion. In this way, the recess 9 having the circular arched sectional shape is formed in the resin layer 23, and the ground layer 8 is formed.

Next, as represented in FIG. 5(D), a metal such as aluminum is deposited on the entire surface of the ground layer 8 to form the reflection layer 3.

Next, as a method for forming the filling layer 12, three methods can be described as an example.

Hereinafter, a method for forming the filling layer 12 will be described.

The first filling layer forming method is as follows.

First, as represented in FIG. 6(A), a resin film 25 of acrylic, epoxy, polyimide or the like is formed on the entire surface of the reflection layer 3. As a method for forming the resin film 25, a liquid resin material is applied on the reflection layer 3 using a method such as spin coating and bar coating. At this time, the film thickness of the resin film 25 is set such that the resin film 25 fills the recess 9 and also covers the flat portion of the reflection layer 3.

Next, as represented in FIG. 6(B), the entire surface of the resin film 25 is etched back using a method such as plasma ashing (dry ashing) or the like. At this time, the etch-back quantity is adjusted so that the upper surface 25a of the resin film 25 is located lower than the plane Q including the flat surface 3a of the reflection layer 3. The filling layer 12 is thus formed.

Next, as represented in FIG. 6(C), the first electrode 4, the organic layer 5 and the second electrode 6 are sequentially formed on the flat surface 3a of the reflection layer 3 and the upper surface 12a of the filling layer 12. The first electrode 4, the organic layer 5, and the second electrode 6 are formed by a known process. For example, pattern formation may be performed by utilizing a vacuum evaporation method using a shadow mask, but is not limited thereto and may be performed using a spray method, an inkjet method, a printing method, a laser transfer method, or the like.

The second filling layer forming method is as follows.

As represented in FIG. 7(A), a resin film 25 of acrylic, epoxy, polyimide or the like is formed on the entire surface of the reflection layer 3. This process is the same as the first filling layer forming method represented in FIG. 6(A).

Next, as represented in FIG. 7(B), the entire surface of the resin film 25 is planarized using a squeegee 27.

At this time, the squeegee 27 is moved along the flat surface 3a of the reflection layer 3 so that the upper surface 25a of the resin film 25 after passage of the squeegee 27 is flush with the plane Q including the flat surface 3a of the reflection layer 3.

Next, as represented in FIG. 7(C), the base material in which the resin film 25 remains in the recess 9 is fired.

The volume of the resin film 25 contracts due to the firing. As a result, the upper surface 25a of the resin film 25 is located lower than the plane Q including the flat surface 3a of the reflection layer 3. The filling layer 12 is thus formed.

Next, as represented in FIG. 7(D), the first electrode 4, the organic layer 5, and the second electrode 6 are sequentially formed on the flat surface 3a of the reflection layer 3 and the upper surface 12a of the filling layer 12. This process is the same as the first filling layer forming method represented in FIG. 6(C).

The third filling layer forming method is as follows.

As represented in FIG. 8(A), a resin film 25 of acrylic, epoxy, polyimide or the like is laminated on the surface of the reflection layer 3 corresponding to the inside of the recess 9. As a method for forming the resin film 25, for example, a droplet-like resin material is applied on the reflection layer 3 using a method such as inkjet. At this time, the discharge quantity of the resin material from the inkjet head 29 is adjusted so that the upper surface 25a of the resin layer 25 is located lower than the plane Q including the flat surface 3a of the reflection layer 3. The filling layer 12 is thus formed.

Next, as represented in FIG. 8(B), the first electrode 4, the organic layer 5, and the second electrode 6 are sequentially formed on the flat surface 3a of the reflection layer 3 and the upper surface 12a of the filling layer 12. This process is the same as the first filling layer forming method represented in FIG. 6(C).

Through the aforementioned processes, the organic EL device 1 of the present embodiment is completed.

Hereinafter, the operation and effect of the first structure section 35 will be described.

FIG. 9(A) is a cross-sectional view representing a conventional organic EL device 101.

The organic EL device 101 has a configuration in which a reflection layer 103, a first electrode 104, an organic layer 105, and a second electrode 106 are sequentially laminated on a substrate 102. In the organic EL device 101, the light emitted from the light-emitting layer in the organic layer 105 is emitted uniformly in all directions, and proceeds inside, while refracting at the interface of each layer with different refractive indexes. The light proceeding toward the substrate 102 is reflected by the reflection layer 103.

Since there is a refractive index difference at the interface between the second electrode 106 and an external space (air), light incident at a small incident angle with respect to the interface is emitted to the external space, and light incident at a large incident angle is reflected at the interface and proceeds inside again. For example, the light L1 emitted from an arbitrary light-emitting point M in the organic layer 105 in a direction close to the side is not easily emitted to the external space, even if the light L1 is refracted at the interface between the layers and the angle slightly changes.

In the route in which the light travels inside the organic EL device 101, at the interface between the second electrode 106 and the external space (air), loss caused by the reflection of light does not occur. In contrast, at the interface between the first electrode 104 and the reflection layer 103, since the reflectance of the metal constituting the reflection layer 103 is generally not 100%, loss caused by the reflection light occurs. Further, some of the light is absorbed by each film while traveling inside the organic EL device 101. Therefore, the light attenuates while traveling inside the organic EL device 101. Normally, the refractive index of the organic layer 105 is approximately 1.8, and in this case, the proportion of the light extracted to the external space in the light emitted from the light-emitting layer is approximately 20%. As described above, the conventional organic EL device 101 has a problem of low light utilization efficiency.

In contrast, in the first structure section 35 of the organic EL device 1 of the present embodiment, as represented in FIG. 9(B), since the reflection layer 3 is curved along the recess 9, the traveling direction of the light reflected by the reflection layer 3 changes, and the light proceeds inside the organic EL device 1. At this time, even if the light originally has a large angle of incidence with respect to the interface between the second electrode 6 and the external space (air), the light converted into the incident angle smaller than the critical angle at the interface between the second electrode 6 and the external space by being reflected by the reflection layer 3 is extracted to the external space.

Particularly, in the case of this embodiment, as described above, the upper surface 12a of the filling layer 12 is located lower than the plane Q including the flat surface 3a of the reflection layer 3, and the lower surface 5b of the organic layer 5 is located lower than the plane Q. That is, the reflection layer 3 is at the sides (a left-right direction in FIG. 9(B)) of the organic layer 5 inside the recess 9. Therefore, for example, the light L1 emitted in a direction close to the part just beside the arbitrary light-emitting point M in the organic layer 5 is reflected by the reflection layer 3, and the angle of the traveling direction changes. As a result, unlike the conventional organic EL device 101 represented in FIG. 9(A), even if the light L1 is emitted in the direction close to the part just beside the light-emitting point M, after the light L1 is reflected by the reflection layer 3, the light L1 can be extracted to the external space at the time of incidence on the interface between the second electrode 6 and the external space at an incident angle smaller than the critical angle. In this way, light utilization efficiency can be improved.

In this embodiment, since the upper surface 12a of the filling layer 12 is located lower than the plane Q and the lower surface 5b of the organic layer 5 is located lower than the plane Q, even if the light is emitted substantially just beside the light-emitting point M, the light can be incident on the reflection layer 3. However, if the upper surface 12a of the filling layer 12 is on the same plane as the plane Q, the lower surface 5b of the organic layer 5 is located higher than the plane Q. In this case, since the reflection layer 3 is not on the side of the organic layer 5 located inside the recess 9, light emitted substantially just beside the light-emitting point M in the organic layer 5 is not incident on the reflection layer 3. However, even in this case, as compared with the conventional organic EL device 101, the rate at which light emitted within a predetermined angular range close to the part just beside the light-emitting point M in the organic layer 5 is incident on the reflection layer 3 increases sufficiently. Therefore, even with the first structure section having such a configuration, it is possible to enhance the light utilization efficiency.

Hereinafter, the operation and effect of the second structure section 36 will be described.

As represented in FIG. 4, the micro-cavity structure 20 of the second structure section 36 has an effect of enhancing light by the resonance of light L2 generated between the reflection layer 3 and the second electrode 6 to emit light L2' having a specific wavelength. In the case of the present embodiment, since the light emitted from the light-emitting layer 16 is green light, the peak wavelength of the emission spectrum is in the green wavelength range of, for example, 500 nm to 570 nm. In order to obtain such an effect, the optical path length between the first electrode 4 and the second electrode 6 is set to an integral multiple of the green emission spectrum peak wavelength. There are various methods for adjusting the optical path length of the micro-cavity structure 20 to a predetermined value, but from the viewpoint of suppressing the influence on the resistance value, for example, it is possible to adopt a method for adjusting the length with the thickness of the hole injection layer 14.

With the micro-cavity structure 20, light emitted from the light-emitting layer 16 is repeatedly reflected within a predetermined optical length range between the reflection layer 3 and the second electrode 6, and light having a specific wavelength corresponding to the optical path length resonantes and is enhanced, and meanwhile, light of a wavelength not corresponding to the optical path length is weakened. As a result, the spectrum of light extracted to the outside is steep and has high intensity, and luminance and color purity are improved. Hereinafter, the effect of the spectrum of light becoming steep and having high intensity due to the micro-cavity structure 20 is called a micro-cavity effect.

Since the organic EL device 1 of the present embodiment combines the first structure section 35 and the second structure section 36, it is possible to obtain the effects of both the first structure section 35 and the second structure section 36. That is, it is possible to achieve the organic EL device 1 excellent in both the light utilization efficiency and the color purity.

In order to verify the effect of the organic EL device 1 of the present embodiment, the inventors of the present invention manufactured a bottom-emission type organic EL device (conventional example), an organic EL device (first comparative example) having only the first structure section 35, and an organic EL device (second comparative example) having only the second structure section 36.

In other words, the organic EL device of the conventional example is an organic EL device that does not express either of the light extraction effect and the micro-cavity effect. The organic EL device of the first comparative example is an organic EL device that expresses only the light extraction effect. The organic EL device of the second comparative example is an organic EL device that expresses only the micro-cavity effect.

In the present embodiment, as the parameter representing the depth of the recess 9 of the first structure section 35, the central angle of the arc which is the sectional shape of the recess 9 is used.

As represented in FIGS. 10(A) and 10(B), the diameter φ of the circle when the recess 9 is viewed in a planar view is constant, and the sectional shape of the recess 9 is defined as a circular arc shape. According to this definition, the depth d1 of the recess 9 can be represented by the central angle θ of the circular arc. That is, if the depth d1 of the recess 9 is deep, the central angle θ increases, and if the depth d1 of the recess 9 is shallow, the central angle θ decreases.

The central angle of the organic EL device of the first comparative example is θ=90°.

The peak intensity, irradiation intensity, luminance, and color purity of the obtained light of the three types of organic EL devices were measured and compared. The peak intensity is the maximum intensity at the peak wavelength of the emission spectrum. The irradiation intensity is an integrated value of the irradiation intensity of each wavelength obtained by dividing the emission spectrum. The luminance is the intensity of the brightness considering the visibility. The color purity was calculated as an x chromaticity coordinate and a y chromaticity coordinate in the x-y chromaticity diagram. In order to easily analyze the phenomenon, all the evaluation items were measurement results from the front direction.

In all the examples, a green light-emitting device was manufactured.

The measurement results are represented in Table 2.

The peak intensity, the irradiation intensity and the luminance of the first and second comparative examples are represented as relative values when the peak intensity, the irradiation intensity and the luminance of the conventional example are set as 1.

TABLE 2

|  |  | Conventional example | First comparative example (only first structure section) | First comparative example (only second structure section) |
|---|---|---|---|---|
| Peak intensity |  | 1 | 2.1 | 2.5 |
| Irradiation intensity |  | 1 | 2.1 | 0.98 |
| Luminance |  | 1 | 2.1 | 1.11 |
| Color | x | 0.38 | 0.38 | 0.23 |
| purity | y | 0.59 | 0.59 | 0.72 |

In Table 2, as can be determined from the result of the first comparative example, the irradiation intensity in the front direction can be set to 2.1 times that of the conventional example by the effect of the first structure section (θ=90°), and the light flux intensity can be set to 2.1 times that of the conventional example. At this time, the extracted light is combined light of light emitted through a complicated optical path length. In this case, since the interference effect of light is neutralized, the shape of the emission spectrum of the first comparative example is substantially the same as the shape of the emission spectrum of the conventional example. FIG. 11 is a graph representing the effect of the light extraction structure of the first comparative example (first structure section) when the irradiation spectrum in the front direction of the conventional example is used as a reference. An abscissa of the graph is the wavelength (nm), and an ordinate is the intensity (no unit, relative value). In FIG. 11, reference symbol S0 is a spectrum of a conventional example, and reference symbol S1 is a spectrum of the first comparative example. According to FIG. 11, it is found that the shape of the spectrum S1 of the first comparative example is substantially similar to the shape of the spectrum S0 of the conventional example, and the intensity is approximately 2.1 times.

FIG. 12 is a graph representing the measurement result of the irradiation intensity in the front direction of the second comparative example having the second structure section (micro-cavity structure). An abscissa of the graph is wavelength [nm] and an ordinate is intensity (no unit, relative value). In FIG. 12, reference symbol S0 is a spectrum of a conventional example, and reference symbol S2 is a spectrum of the second comparative example. According to FIG. 12, it is found that, due to the micro-cavity effect, the peak intensity of the second comparative example at a wavelength in the vicinity of 530 nm is 2.5 times the peak intensity of the conventional example, and the peak intensity changes to a steep spectrum. The steepness of the spectrum makes it possible to enhance the color purity. However, it is found that the energy emission quantity of light, that is, the area of the spectrum of FIG. 12, is hard to improve.

Although it will be described in detail later, since the organic EL device 1 of the present embodiment has a structure which combines the first structure section 35 and the second structure section 36, both effects can be achieved.

The degree of effect of the extraction structure and the degree of effect of the micro-cavity structure can be adjusted by changing the ratio or the like of the installation area of both.

The x-y chromaticity diagram indicates that, as the x chromaticity coordinate is small and the y chromaticity coordinate is large in green, the color purity of green is high. From this point of view, it can be seen from [Table 2] that the second comparative example having the second structure section can greatly improve the color purity. Meanwhile, in the second comparative example, the luminance is 1.11, which is not much of an improvement as compared with the conventional example. This is thought to be due to the fact that a micro-cavity effect is generated at a wavelength of 530 nm with a focus on color purity, in the broad emission spectrum. If the micro-cavity effect is generated at a wavelength at which the visibility is high, the luminance can also be improved. Meanwhile, in the first comparative example having the first structure section, the intensity and luminance are all 2.4 times, but the color purity is no different from that of the conventional example.

Next, since the organic EL device 1 of the present embodiment is an element having both of the first structure section 35 and the second structure section 36, in order to verify the effect, the inventors of the present invention manufactured nine kinds of elements which include elements in which the installation area ratio of the first structure section 35 and the second structure section 36 in the organic EL device changes in units of 10% from 0% to 70%, and elements in which the ratio of the area of the installation area of the first structure section 35 and the second structure section 36 is set to 78.5%. The installation area ratio of the first structure section 35 and the second structure section 36 is indicated as the installation area ratio of the first structure section 35 to the unit area. The peak intensity, irradiation intensity, luminance and x-y chromaticity coordinates of the 11 types of organic EL devices were determined in the same manner as above.

Since the planar shape of the recess 9 of the first structure section 35 is a circle, when the area ratio of the first structure section 35 is maximized, the circle having the planar shape of the recess becomes a circle inscribed in a square defining the unit area. At this time, when one side of the square shape is set as A, the installation area ratio x of the first structure section 35 is $x=\{(A/2)^2 \times \pi\}/A^2=0.785$ (78.5%). That is, even when the area ratio of the first structure section 35 is maximized, the second structure section 36 of 21.5% exists.

FIG. 13 is a graph representing changes in peak intensity, irradiation intensity, and luminance when the installation area ratio of the first structure section changes. The abscissa of the graph is the installation area ratio (%) of the first structure section, and the ordinate of the graph is the peak intensity, irradiation intensity and luminance value (no unit, relative value). The values of the peak intensity, the irradiation intensity and the luminance are represented as relative values when the value of the above-mentioned conventional example is set as 1.

FIG. 14 is a graph representing a change in the spectrum when the installation area ratio of the first structure section changes. The abscissa of the graph is the wavelength (nm), and the ordinate of the graph is the intensity (no unit, relative value). The intensity on the ordinate is represented as a relative value when the peak intensity of the conventional example is set as 1. Spectra when the installation area ratio of the first structure section is 0%, 30%, 50%, 80% and 100% are represented.

FIG. 15 is a diagram representing changes in chromaticity coordinates when the installation area ratio of the first structure section changes. The abscissa of the graph is an x chromaticity coordinate and the ordinate of the graph is a y chromaticity coordinate.

According to the results of FIGS. 13 to 15, it is found that irradiation intensity and luminance can be enhanced by relatively increasing the installation area ratio of the first structure section, that is, the ratio of the light extraction structure.

Meanwhile, it is found that color purity can be enhanced by relatively increasing the installation area ratio of the second structure section, that is, the ratio of the micro-cavity structure. This indicates that emission characteristics can be controlled by adjusting the area ratio between the first structure section and the second structure section.

An optimal area ratio may be used, depending on whether the specification required for the organic EL device places emphasis on the irradiation intensity or the luminance or the color purity. As described above, according to the present embodiment, it is proved that an organic EL device satisfying both of the luminance and the color purity can be achieved.

Although an example of a green light-emitting element has been described in this embodiment, the same effect can be obtained for a light-emitting element of another color such as a red light-emitting element or a blue light-emitting element. The aforementioned effects are not limited to a specific luminescent color. Further, in the aforementioned verification results, concrete numerical values of the green light-emitting element are represented, but similar results are obtained for the red light-emitting element and the blue light-emitting element.

Second Embodiment

Hereinafter, a second embodiment of the present invention will be described with reference to FIG. 16.

A basic configuration of the organic EL device of the second embodiment is the same as that of the first embodiment, and the material of the filling layer is different from that of the first embodiment.

FIG. 16 is a cross-sectional view of an organic EL device of the second embodiment.

In FIG. 16, the same constituent elements as those in FIG. 3 used in the first embodiment are denoted by the same reference numerals, and the detailed description thereof will not be provided.

In the first embodiment, a resin material having a refractive index of 1.5 is used as the filling layer. Meanwhile, in the organic EL device 31 of the present embodiment, as represented in FIG. 16, a resin having a refractive index of 1.8 or 1.9 is used as the constituent material of the filling layer 32. Other configurations are the same as those of the first embodiment. A resin material having a refractive index of 1.8 or 1.9 can be manufactured, for example, by mixing an appropriate quantity of zirconia nanoparticles with an olefinic resin having a refractive index of 1.65. The refractive index can be adjusted by changing the mixing ratio of the zirconia nanoparticles. Further, in the organic EL device including the filling layer made of a resin having a refractive index of 1.9, the refractive index of ITO constituting the first electrode 4 was also adjusted to 1.9. Although the refractive index of ordinary ITO is approximately 2.0, the refractive index of ITO can be reduced to about 1.9 by changing the film forming conditions of ITO and setting the film density to be lower than usual.

In the first structure section 38 of the organic EL device 31, the light emitted from the light-emitting layer is guided to the filling layer 32, reflected by the reflection layer 3, and extracted from the upper surface. In the light guiding path, the component having the highest refractive index is the first electrode 4. According to Snell's law, light has a component that can enter from a material with a low refractive index to a material with a high refractive index, but cannot enter from a material with a high refractive index to a material with a low refractive index, because it is totally reflected at the interface. Therefore, in the configuration of the first embodiment, some of the light incident on the first electrode 4 cannot enter the filling layer 12 having a lower refractive index than the first electrode 4, and is reflected at the interface between the first electrode 4 and the filling layer 12.

In order to reduce this type of light loss, it is desirable to reduce the difference in refractive index between the light-emitting layer and the filling layer 12 and between the first electrode 4 and the filling layer 12 as much as possible. In the organic EL device 31 of the present embodiment, the filling layer 32 has a refractive index of 1.8 or 1.9, which is substantially equal to the refractive index of the organic layer 5 and the first electrode 4. Therefore, it is possible to provide the organic EL device 31 having higher light utilization efficiency. The effect of improving the color purity by the second structure section 39 is the same as in the first embodiment.

In order to verify the effect of the organic EL device 31 of the present embodiment, the inventors manufactured an organic EL device reflecting the embodiment and measured light extraction efficiency. As a result of the evaluation, according to the organic EL device 31 of the present embodiment, it was possible to improve the light extraction efficiency by approximately 10% as compared with the first embodiment.

Third Embodiment

Hereinafter, a third embodiment of the present invention will be described with reference to FIG. 17.

A basic configuration of the organic EL device of the third embodiment is the same as that of the first embodiment, and a configuration of a reflection layer is different from that of the first embodiment.

FIG. 17 is a cross-sectional view of the organic EL device of the third embodiment.

In FIG. 17, the same constituent elements as those in FIG. 3 used in the first embodiment are denoted by the same reference numerals, and the detailed description thereof will not be provided.

In the first embodiment, a metal material such as aluminum is used as the reflection layer. Meanwhile, in an organic EL device 41 of the present embodiment, as represented in FIG. 17, a dielectric multilayer film is used as a reflection layer 43. The dielectric multilayer film has a structure in which high refractive index materials such as $TiO_3$ and $Ta_2O_3$ and low refractive index materials such as $SiO_2$ and $MgF_2$ are alternately laminated. The laminated structure of the dielectric multilayer film is desirably designed and formed to widen a reflection band and to obtain a reflectance of approximately 100%, regardless of the incident angle in a visible light region. Other configurations are the same as those in the first embodiment.

The reflectance of aluminum is approximately 90% and the reflectance of silver is approximately 95%. That is, the reflectance of the metal film is not 100%. Therefore, the intensity of light decreases each time the light is reflected by the metal film.

As in the first embodiment, when a metal film is used for the reflection layer 3, a loss occurs every time light is reflected by the reflection layer 3. As represented in the path of light in FIG. 9(B), in a process in which light is emitted from the upper surface of the second electrode 6, since there is hardly a case in which light is reflected many times by the reflection layer 3, loss of light caused by the reflection is also limited. However, when the light is only reflected once by the reflection layer 3, the intensity of the light is reduced by at least about 5 to 10%. Meanwhile, the reflectance of the dielectric multilayer film is approximately 100%. Therefore, when a dielectric multilayer film is used for the reflection layer 43 as in the present embodiment, there is almost no loss of light due to reflection. This operation and effect are common to both of the first structure section 45 and the second structure section 46. Therefore, it is possible to provide the organic EL device 41 having high light utilization efficiency. The effect of improving the color purity by the second structure section 46 is the same as in the first embodiment.

In order to verify the effect of the organic EL device 41 of the present embodiment, the inventors manufactured an organic EL device reflecting this embodiment and measured light extraction efficiency. As a result of the evaluation, according to the organic EL device 41 of the present embodiment, the light extraction efficiency in the first structure section 45 is improved by approximately 10% as compared with the first embodiment, and it is possible to improve the light extraction efficiency in the second structure section 46 by approximately 5% compared with the first embodiment.

Fourth Embodiment

Hereinafter, a fourth embodiment of the present invention will be described with reference to FIG. 18.

A basic configuration of the organic EL device of the fourth embodiment is the same as that of the first embodiment, and a configuration of a reflection layer is different from that of the first embodiment.

FIG. 18 is a cross-sectional view of the organic EL device of the fourth embodiment.

In FIG. 18, the same constituent elements as those in FIG. 3 used in the first embodiment are denoted by the same reference numerals, and the detailed description thereof will not be provided.

In the first embodiment, a metal material such as aluminum is used as the reflection layer. In contrast, in an organic EL device 51 of the present embodiment, as represented in FIG. 18, a scattering layer having light scattering properties is used as a reflection layer 53. The scattering layer can be formed, for example, by applying a barium sulfate solution. The reflectance of the film made of barium sulfate is approximately 98%. Other configurations are the same as those of the first embodiment.

As described in the third embodiment, in general, since the reflectance of the metal film does not reach 100%, the intensity of light decreases due to the reflection. As in the first embodiment, when a metal film is used for the reflection layer 3, a loss occurs every time light is reflected by the reflection layer 3. Further, in the first structure section 55, when light advancing in a direction close to the part just beside the organic layer 5, light totally reflected at the interface between the first electrode 4 and the filling layer 12, and the like enter the end portion of the recess 9, the light is regularly reflected by the reflection layer 3 made of a metal film. Accordingly, in some cases, the light may travel in the opposite direction at the same angle to become light which is extracted to the outside. Meanwhile, when a scattering layer is used for the reflection layer 53 as in this embodiment, the light reflected by the reflection layer 53 travels in all directions. Therefore, when a metal film is used for the reflection layer, a part of the light that cannot be extracted to the outside can be extracted using the scattering layer as the reflection layer. Further, since the reflectance of the scattering layer is equal to or greater than that of the metal film, the loss of light at the time of reflection can be reduced. Due to these factors, it is possible to provide the organic EL device 51 having higher light utilization efficiency. The effect of improving the color purity by the second structure section 56 is the same as in the first embodiment.

In order to verify the effect of the organic EL device 51 of the present embodiment, the inventors manufactured an organic EL device reflecting this embodiment and measured light extraction efficiency. As a result of the evaluation, according to the organic EL device 51 of the present embodiment, it was possible to improve the light extraction efficiency in the first structure section 55 by approximately 5% to 10% as compared with the first embodiment.

Fifth Embodiment

Hereinafter, a fifth embodiment of the present invention will be described with reference to FIG. 19.

A basic configuration of an organic EL device of the fifth embodiment is the same as that of the first embodiment, and a first structure section and a second structure section are different from those of the first embodiment.

FIG. 19 is a plan view of the organic EL device of the fifth embodiment.

In FIG. 19, the same constituent elements as those in FIG. 2 used in the first embodiment are denoted by the same reference numerals, and the detailed description thereof will not be provided.

In this embodiment, an example is represented in which the organic EL device is applied to a display device having a plurality of pixels disposed, for example, in a matrix shape.

As represented in FIG. 19, the organic EL device 71 of the present embodiment includes a plurality of pixels P disposed in a matrix shape. One pixel P includes two sub-pixels of a first sub-pixel SPA and a second sub-pixel SPB. The shape of the pixel P is a square. Each of the first sub-pixel SPA and the second sub-pixel SPB has a rectangular shape. The size of the pixel is set such that one side of the square is, for example, 200 µm.

The first sub-pixel SPA corresponds to a first unit light-emitting region of the claims, and the second sub-pixel SPB corresponds to a second unit light-emitting region of the claims.

Each of the first sub-pixel SPA and the second sub-pixel SPB has a configuration capable of independently applying an electric field (driving). In the present embodiment, a plurality of data lines 72 and a plurality of scanning lines 73 are provided on a substrate. One sub-pixels SPA and SPB are provided in a region surrounded by the mutually adjacent data lines 72 and the mutually adjacent scanning lines 73. The first electrode described in the first embodiment is separated for each sub-pixel, and each of the first electrodes is connected to the data line 72 and the scanning line 73 via a switching element 74 such as a thin film transistor (hereinafter abbreviated as TFT). That is, the organic EL device 71 of the present embodiment is an active matrix organic EL device. Here, although an active matrix system using TFTs is adopted as a configuration in which an electric field is independently applied to each of the sub-pixels SPA and SPB, it is not limited thereto and it is also possible to use a system such as a simple matrix system and a segment drive system.

Focusing on a plurality of rows of sub-pixels arranged along the data line 72, a column of first sub-pixels SPA having a first structure section 75 and a second structure section 76 having an installation area ratio of at least 21.5%, and a column of the second sub-pixel SPB having only the second structure section 76 are alternately arranged. For example, the column of the first sub-pixel SPA at the left end has a first structure section 75, and a second structure section 76 having an installation area ratio of at least 21.5%. The second column of the second sub-pixel SPB from the left has only the second structure section 76, and the third and subsequent columns from the left are repeated. Regarding the shape of the recess of the first structure section 75, for example, the central angle θ is set to 90°.

Also in this embodiment, as in the first to fourth embodiments, it is possible to achieve an organic EL device excellent in both of the light utilization efficiency and the color purity. Particularly, in the case of this embodiment, one pixel is divided into two sub-pixels of a first sub-pixel SPA and a second sub-pixel SPB. Therefore, by changing the area ratio of the first sub-pixel SPA and the second sub-pixel SPB, the ratio between the light extraction effect and the micro-cavity effect can be controlled in the same manner as in the first embodiment.

Further, since each of the first sub-pixel SPA and the second sub-pixel SPB can be independently driven, it is possible to cause only one of the first sub-pixel SPA and the second sub-pixel SPB to emit light. Thus, it is possible to switch whether to exhibit only the light extraction effect or only the micro-cavity effect.

In order to verify the effect of the organic EL device 71 of the present embodiment, the inventors manufactured an organic EL device reflecting this embodiment, and adjusted the ratio of the light extraction effect and the micro-cavity effect.

As a first method for adjusting the ratio of the two effects, an element in which the area ratio between the first sub-pixel SPA and the second sub-pixel SPB is changed between 0% and 100% is manufactured, the same current is supplied to the first sub-pixel SPA and the second sub-pixel SPB, and the entire pixel is caused to emit light. By changing the area ratio between the first sub-pixel SPA and the second sub-pixel SPB in this manner, the ratio between the strength improvement effect and the color purity improvement effect can be adjusted as in the first embodiment.

As a second method for adjusting the ratio of the two effects, the area of the first sub-pixel SPA and the area of the second sub-pixel SPB are set to the same level (area ratio: 50%). Then, a current is supplied to only one of the first sub-pixel SPA and the second sub-pixel SPB. As a result of supplying the current to only the first sub-pixel SPA to emit light, luminescence is observed with almost uniform intensity in all directions. As a result of supplying the current only to the second sub-pixel SPA to emit light, light emission with high directivity and high color purity is observed in the front direction of the organic EL device. In this manner, by switching turning on/off of each sub-pixel, an organic EL device capable of switching light emission characteristics can be achieved.

As the third method for adjusting the ratio of the two effects, the areas of the first sub-pixel SPA and the second sub-pixel SPB are set to the same level (area ratio: 50%) as in the second method. Further, the quantity of current supplied to the first sub-pixel SPA and the quantity of current supplied to the second sub-pixel SPB are made different from each other. The ratios of the quantity of current supplied to each sub-pixel SPA are made different from each other, and as a result of the measurement, it was possible to control the intensity and color purity of the obtained light.

Sixth Embodiment

Hereinafter, a sixth embodiment of the present invention will be described with reference to FIG. 20.

A basic configuration of an organic EL device of the sixth embodiment is the same as that of the fifth embodiment, and the sixth embodiment is characterized by the current waveform for each sub-pixel.

FIG. 20 is a diagram representing current waveforms of each sub-pixel in the organic EL device of the sixth embodiment.

In the present embodiment, as in the fifth embodiment, one pixel P is divided into two, and two sub-pixels are provided in one pixel P. As in the fifth embodiment, the dimension of the pixel P is, for example, 200 µm on a side of a square. In the present embodiment, the areas of the first sub-pixel SPA and the second sub-pixel SPB are the same (area ratio: 50%). Furthermore, since it is possible to independently drive (apply an electric field) the first sub-pixel SPA and the second sub-pixel SPB, the method for independently driving the sub-pixels is the same as in the fifth embodiment.

As in the fifth embodiment, a first structure section (a central angle θ of the recess=90°) is provided in the first sub-pixel SPA. A second structure section is provided in the second sub-pixel SPA.

As in the first embodiment, the organic EL device includes a green light-emitting element.

As represented in FIG. 20, the waveform of the current supplied to each of the first sub-pixel SPA and the second sub-pixel SPB is a pulse waveform. Although the frequency of the pulse waveform is not particularly limited, the frequency is set to, for example, 60 Hz. The period of one frame is set to 16.7 msec in accordance with the 60 Hz driving, and current is supplied to each sub-pixel in the sub-frame period in which one frame is divided into two. The pulse waveform in the first sub-pixel SPA and the pulse waveform in the second sub-pixel SPB are different from each other in phase.

The light emission quantity is determined by the current value and the length of the sub-frame period. According to FIG. 20, the light emission quantity is determined by the area obtained by multiplying the current value (ordinate) by the sub-frame period (abscissa). The quantity of current corresponding to the area of the pulse waveform is called an effective current value. The effective current quantity is proportional to the light emission quantity.

When the effective current is supplied at a frequency of 60 Hz, each sub-pixel actually repeats lighting and non-lighting, but it is not possible for the eyes of a user to distinguish between the lighting and the non-lighting, and the sub-pixel is observed to be always lit.

Also in this embodiment, as in the first to fifth embodiments, it is possible to achieve an organic EL device excellent in both the light utilization efficiency and the color purity. Particularly, in the case of this embodiment, by changing the ratio of the effective current value corresponding to each sub-frame period, it is possible to adjust the light emission quantity from each sub-pixel to control the ratio between the intensity enhancement effect and the color purity enhancement effect.

In order to verify the effect of the organic EL device of the present embodiment, the present inventors manufactured an organic EL device reflecting this embodiment, and changed the ratio of the effective current value corresponding to each sub-frame period from 0% to 100% to adjust the ratio of the light extraction effect and the micro-cavity effect. As described above, even if the areas of the first sub-pixel SPA and the second sub-pixel SPB are the same, it is found that the ratio of the two effects can be controlled by changing the ratio of the effective current value corresponding to each sub-frame period.

Seventh Embodiment

Hereinafter, a seventh embodiment of the present invention will be described with reference to FIG. 21.

A basic configuration of an organic EL device of the seventh embodiment is the same as that of the first embodiment, and a first structure section and a second structure section are differently formed from those of the first embodiment.

FIG. 21 is a plan view of an organic EL device of the seventh embodiment.

In FIG. 21, the same constituent elements as those in FIG. 2 used in the first embodiment are denoted by the same reference numerals, and the detailed description thereof will not be provided.

As represented in FIG. 21, an organic EL device 81 of the present embodiment includes a first structure section 82 and a second structure section 83. The second structure section 83 is provided in the central portion of the organic EL device 81, and the first structure section 82 is provided around the second structure section 83. The planar shape of the organic EL device 81 is a square, and the length of one side of the square is, for example, 5 cm. The planar shape of the formation region of the second structure section 83 is a square, and the length of one side of the square is, for example, 4 cm. The planar shape of the formation region of the first structure section 82 is a rectangular annular shape, and its width is, for example, 1 cm. A central angle of the recess 84 of the first structure section 82 is θ=30°. The organic EL device 81 includes a green light-emitting element. The first structure section 82 and the second structure section 83 can be driven independently of each other.

The method for independently driving the first structure section 82 and the second structure section 83 are the same as those of the fifth and sixth embodiments.

The organic EL device 81 of the present embodiment is a surface light-emitting device having a 5 cm square and can be used as, for example, a lighting device. Since the organic EL device 81 includes the first structure section 82 and the second structure section 83, it is possible to control the directivity of the light emitted from the light emission surface of the organic EL device 81. For example, in a case in which the organic EL device 81 is installed with the light emission surface facing downward, when the second structure section 83 at the center is turned on, light with high brightness and high color purity can be obtained just below the organic EL device 81. When the surrounding first structure section 82 is turned on, bright light is obtained over a wide range.

As in the sixth embodiment, the ratio of the two effects can be controlled by adjusting the ratio of the effective current value. For example, if the effective current value of the first structure section 82 is set as 0% and the effective current value of the second structure section 83 is set as 100%, it can be used as a spotlight for lighting a narrow region with light of high color purity. Conversely, if the effective current value of the first structure section 82 is set as 100% and the effective current value of the second structure section 83 is set as 0%, it can be used as a lighting device that lights a wide area with high luminance as a whole. By adjusting the ratio of the effective current value within the aforementioned range, it is possible to achieve a lighting device having directivity as required.

For example, as in the organic EL device 91 represented in FIG. 22, by spreading the first light-emitting element 93 having the first structure section 92 and the second light-emitting element 95 having the second structure section 94, a large lighting device can be manufactured. For example, by vertically and horizontally spreading light-emitting elements of 5 cm square, a lighting device of 30 cm square can be manufactured. In the organic EL device 91, a plurality of first light-emitting elements 93 having a first structure section 92 are disposed in a central region of 20 cm square. A plurality of second light-emitting elements 95 having the second structure section 94 are disposed in a region of a width of 10 cm outside the plurality of first light-emitting elements 93. In this way, by arranging a plurality of light-emitting elements, a large organic EL device having the effect of the above embodiment can be manufactured.

The technical scope of the present invention is not limited to the aforementioned embodiments, and various modifications can be made without departing from the spirit of the present invention.

In the above embodiments, the case in which the cross-sectional shape of the recess is a circular arc shape has been described as an example, but the cross-sectional shape of the recess may not necessarily be a circular arc shape. The cross-sectional shape of the recess may include, for example, an ellipse or an arbitrary curve, or may include a part of a straight line.

Also, the recesses constituting the first structure section need not all have the same shape, and may have a plurality of types of recesses having different shapes from each other.

In addition, specific configurations such as the shape, size, number, arrangement, constituent material and forming process of each part of the organic EL device are not limited to the aforementioned embodiments, and can be appropriately changed. In addition to the display device, the organic EL device of the present invention can also be applied to a lighting device or the like.

INDUSTRIAL APPLICABILITY

The present invention can be applied to an arbitrary electronic device including a light-emitting portion such as a display device or a lighting device.

DESCRIPTION OF THE REFERENCE SYMBOLS

1, 31, 41, 51, 61, 71 Organic EL device
2 Base material
3, 43, 53 Reflection layer
4 First electrode
5 Organic layer
6 Second electrode
9, 84 Recess
12, 32 Filling layer
16 Light-emitting layer
35, 38, 45, 55, 75, 82 First structure section
36, 39, 46, 56, 76, 83 Second structure section

The invention claimed is:

1. An organic electroluminescence device comprising:
   a base material;
   a first structure section provided on the base material; and
   a second structure section provided on the base material,
   wherein the first structure section comprises:
      a recess provided in the base material;
      a first reflection layer provided along a surface of the recess;
      a filling layer having light transmissivity filled in the recess via the first reflection layer;
      a first electrode having light transmissivity provided on an upper layer side of the filling layer;
      a first organic layer comprising a first light-emitting layer provided on an upper layer side of the first electrode; and
      a second electrode having light transmissivity and light reflectivity provided on an upper layer side of the first organic layer,
   wherein the second structure section comprises:
      a second reflection layer provided on a flat surface of the base material;
      a third electrode having light transmissivity provided on an upper layer side of the second reflection layer;
      a second organic layer comprising a second light-emitting layer provided on an upper layer side of the third electrode; and
      a fourth electrode having light transmissivity and light reflectivity provided on an upper layer side of the second organic layer.

2. The organic electroluminescence device according to claim 1,
   wherein the second structure section has a micro-cavity structure.

3. The organic electroluminescence device according to claim 1, wherein a first part of the first reflection layer and a second part of the first electrode are in contact with each other at an end portion of the first structure section.

4. The organic electroluminescence device according to claim 1,
wherein, in the first structure section, a lower surface of the first electrode at a position of the recess is located lower than a plane including the flat surface.

5. The organic electroluminescence device according to claim 4,
wherein a lower surface of the first light-emitting layer at the position is located lower than the flat surface.

6. The organic electroluminescence device according to claim 1,
wherein the second electrode is made of a metal film.

7. The organic electroluminescence device according to claim 1,
wherein a cross-sectional shape of the recess cut by an arbitrary plane perpendicular to the flat surface is a circular arc shape.

8. The organic electroluminescence device according to claim 1,
wherein the first electrode is provided in contact with an upper surface of the filling layer, and
a first refractive index of the filling layer is substantially equal to a second refractive index of the first electrode.

9. The organic electroluminescence device according to claim 1,
wherein a first refractive index of the filling layer is substantially equal to a second refractive index of the first light-emitting layer.

10. The organic electroluminescence device according to claim 1,
wherein the first reflection layer and the second reflection layer are made of a dielectric multilayer film.

11. The organic electroluminescence device according to claim 1,
wherein the first reflection layer and the second reflection layer have light scattering properties.

12. The organic electroluminescence device according to claim 1, the organic electroluminescence device further comprising:
a plurality of unit light-emitting regions,
wherein the plurality of unit light-emitting regions comprise:
a first unit light-emitting region having the second structure section in which an area ratio per unit area to the first structure section is at least 21.5%, and
a second unit light-emitting region having the second structure section.

13. The organic electroluminescence device according to claim 12,
wherein a first area of the first unit light-emitting region and a second area of the second unit light-emitting region are different from each other.

14. The organic electroluminescence device according to claim 12,
wherein the first unit light-emitting region and the second unit light-emitting region are capable of being driven independently of each other.

15. The organic electroluminescence device according to claim 12,
wherein only one of the first unit light-emitting region and the second unit light-emitting region is capable of emitting light.

16. The organic electroluminescence device according to claim 12,
wherein a first current supplied to the first unit light-emitting region and a second current supplied to the second unit light-emitting region are different from each other.

17. The organic electroluminescence device according to claim 12,
wherein a first waveform of a first current supplied to the first unit light-emitting region and a second waveform of a second current supplied to the second unit light-emitting region are pulse waveforms.

18. The organic electroluminescence device according to claim 17,
wherein a first pulse waveform in the first unit light-emitting region and a second pulse waveform in the second unit light-emitting region are different from each other.

19. The organic electroluminescence device according to claim 17,
wherein a frequency of the first pulse waveform and the second pulse waveform are 60 Hz or more.

20. A method for manufacturing an organic electroluminescence device, the method comprising:
forming a recess in a base material;
forming a reflection layer over a surface of the recess and a flat surface of the base material;
forming a filling layer having light transmissivity inside the recess via the reflection layer;
forming a first electrode having light transmissivity on an upper layer side of the filling layer, in a first structure section comprising the recess, and forming the first electrode on an upper layer side of the reflection layer, in a second structure section corresponding to the flat surface of the base material;
forming an organic layer comprising a light-emitting layer on an upper layer side of the first electrode; and
forming a second electrode having light transmissivity and light reflectivity on an upper layer side of the organic layer.

* * * * *